(12) United States Patent
Murayama et al.

(10) Patent No.: US 8,394,678 B2
(45) Date of Patent: Mar. 12, 2013

(54) SEMICONDUCTOR CHIP STACKED BODY AND METHOD OF MANUFACTURING THE SAME

(75) Inventors: Kei Murayama, Nagano (JP); Akinori Shiraishi, Nagano (JP); Mitsuhiro Aizawa, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 393 days.

(21) Appl. No.: 12/626,069

(22) Filed: Nov. 25, 2009

(65) Prior Publication Data
US 2010/0133677 A1 Jun. 3, 2010

(30) Foreign Application Priority Data

Nov. 28, 2008 (JP) .................................. 2008-305187
Jan. 21, 2009 (JP) .................................. 2009-010828
Jun. 23, 2009 (JP) .................................. 2009-149116
Nov. 24, 2009 (JP) .................................. 2009-266485

(51) Int. Cl.
*H01L 21/00* (2006.01)
*H01L 23/02* (2006.01)
*H01L 23/22* (2006.01)
*H01L 23/24* (2006.01)
*H01L 23/52* (2006.01)

(52) U.S. Cl. ........ 438/114; 438/108; 438/110; 438/113; 257/685; 257/686; 257/687; 257/691

(58) Field of Classification Search .......... 438/106–127, 438/460–465; 257/678–733
See application file for complete search history.

(56) References Cited

U.S. PATENT DOCUMENTS

| 6,445,063 | B1* | 9/2002 | King et al. ..................... 257/686 |
| 6,903,465 | B2* | 6/2005 | Farnworth et al. ............ 257/787 |
| 7,285,444 | B2* | 10/2007 | Danno .......................... 438/111 |
| 7,892,894 | B2* | 2/2011 | Do et al. ........................ 438/113 |
| 2007/0158807 | A1* | 7/2007 | Lu et al. ......................... 257/686 |
| 2007/0232061 | A1* | 10/2007 | Okada et al. .................. 438/628 |
| 2008/0303131 | A1* | 12/2008 | McElrea et al. .............. 257/686 |
| 2009/0206458 | A1* | 8/2009 | Andrews et al. .............. 257/676 |

FOREIGN PATENT DOCUMENTS

| JP | 2000-340694 | * 12/2000 |
| JP | 3895768 | 12/2006 |

* cited by examiner

*Primary Examiner* — Fernando L Toledo
*Assistant Examiner* — Karen Kusumakar
(74) *Attorney, Agent, or Firm* — Rankin, Hill & Clark LLP

(57) ABSTRACT

A plurality of chip sealing bodies stacked on a wiring substrate with a connection terminal. The chip sealing body includes a semiconductor chip having a semiconductor integrated circuit, a pad and a conductive connecting material, and a resin sealing the semiconductor chip. The chip sealing body is shaped into a cubic form in which a portion of the conductive connecting material except an end portion located on an external device side and all surfaces of semiconductor chip is sealed by the resin and the end portion of the conductive connecting material located on the external device side is exposed from the cubic form. A conductive bonding wire connects the end portions of the conductive connecting materials and the connection terminal respectively. A resin sealing material seals the plurality of chip sealing bodies, the conductive bonding wire, and the wiring substrate.

21 Claims, 42 Drawing Sheets (ENLARGED VIEW OF A PORTION)

(ENLARGED VIEW OF B PORTION)

(PORTION CORRESPONDING TO A PORTION IN FIG. 8)

(PORTION CORRESPONDING TO B PORTION IN FIG. 8)

(a)

(b)

(c)

(d)

(e)

(f)

(g)

(h)

(i)

(j)

(g)

SEMICONDUCTOR CHIP STACKED BODY AND METHOD OF MANUFACTURING THE SAME

This application claims priorities to Japanese Patent Application No. 2008-305187, filed Nov. 28, 2008, Japanese Patent Application No. 2009-010828, filed Jan. 21, 2009, Japanese Patent Application No. 2009-149116, filed Jun. 23, 2009, and Japanese Patent Application No. 2009-266485, filed Nov. 24, 2009, in the Japanese Patent Office. The Japanese Patent Application No. 2008-305187, the Japanese Patent Application No. 2009-010828, the Japanese Patent Application No. 2009-149116, and the Japanese Patent Application No. 2009-266485 are expressly incorporated by reference herein in their its entirety.

TECHNICAL FIELD

The present disclosure relates to a semiconductor chip stacked body and a method of manufacturing the same.

RELATED ART

The research and development of the high-density packaging technology of the semiconductor device are advanced now to respond to needs such as higher performance, size reduction, etc. of the mobile information equipment or the small electronic equipment. In particular, the new package is constructed by employing the chip size package (CSP), in which individual semiconductor chips obtained by dividing the semiconductor wafer including the integrated circuit are packaged, solely or in combination, and also is utilized in the mobile information equipment, the small electronic equipment, and the like.

The technology to stack the chips in one field of the CSP is widely used in response to a recent increase in capacity of the memory, and the like. The technology to stack the chips is applied to build up the new package by stacking the already-known and reliable semiconductor chips.

[Patent Literature 1] JP-A-2000-340694
[Patent Literature 2] Japanese Patent No. 3895768

As set forth in Patent Literature 1 and Patent Literature 2, various proposals have been made on the chip stacking technology. However, employed structures and manufacturing methods are complicated, and thus the chip stacking technology is not so advanced to satisfy the demands in the industrial worlds. FIG. 1 is a view showing stacked chips in the related art. A plurality of semiconductor chips 11 are stacked stepwise such that their integrated circuit surfaces 12 are set in parallel with a face of a wiring substrate 13. Then, respective pads 14 arranged on edges of respective semiconductor chips 11 are connected by using bonding wires 16, and also the pads 14 and connection terminals 15 on the wiring substrate 13 are connected by using the bonding wires 16. A wiring length of the bonding wires, which are connected sequentially to the pads arranged stepwise and then connected to the connection terminals of the substrate, becomes longer on account of the stepwise connection, and thus the electrical characteristics are degraded in some cases. Also, an occupied area of the overall chip stacking body is increased on account of the stepwise stacking, and thus a product whose packaging density is sufficiently high cannot be obtained in some cases. Also, steps of manufacturing the chip stacking body are complicated, and thus a reduction in productivity, and the like are caused.

SUMMARY

Exemplary embodiments of the present invention provide a semiconductor chip stacked body and a method of manufacturing the same.

A semiconductor chip stacked body according to a first aspect of the invention, comprises:

a plurality of chip sealing bodies, each of the chip sealing bodies including a semiconductor chip, which has a semiconductor integrated circuit, a pad and a conductive connecting material connecting the pad to an external device, and a resin sealing the semiconductor chip, each of the chip sealing bodies being shaped into a cubic form in which a portion of the conductive connecting material except an end portion located on an external device side and all surfaces of semiconductor chip is sealed by the resin and the end portion of the conductive connecting material located on the external device side is exposed from the cubic form;

a wiring substrate which has a connection terminal;

a conductive bonding wire which connects the end portions of the conductive connecting materials in the plurality of chip sealing bodies and the connection terminal respectively; and a resin sealing material which seals the plurality of chip sealing bodies, the conductive bonding wire, and the wiring substrate, wherein the plurality of chip sealing bodies are stacked on the wiring substrate, and exposed end portions of the conductive connecting materials in the chip sealing bodies are conductively connected by the conductive bonding wire respectively.

A method of manufacturing a semiconductor chip stacked body, according to a second aspect of the invention, having a plurality of chip sealing bodies which are stacked and conductively connected mutually, and a wiring substrate which mounts the plurality of chip sealing bodies thereon, each of the chip sealing body including a semiconductor chip having a semiconductor integrated circuit, a pad and a conductive connecting material, and a resin sealing the semiconductor chip, comprises:

a step of dicing a semiconductor wafer, which has semiconductor integrated circuits and pads, by using a dicing tape, into individual pieces to form the plurality of semiconductor chips;

a step of forming a plurality of chip sealing bodies by connecting the pads of the semiconductor chips obtained by the dicing step to each other by the conductive connecting material respectively on the dicing tape, sealing the semiconductor chips with the resin, peeling the dicing tape, sealing portions of the semiconductor chips exposed by the peeling with the resin, and then dicing a resultant structure into individual pieces;

a step of forming a chip stacked body by stacking the plurality of chip sealing bodies, and then connecting conductively end portions of the conductive connecting materials, which are exposed from surfaces of the plurality of chip sealing bodies, by a conductive bonding wire mutually; and a step of mounting the chip stacked body on the wiring substrate, and then connecting the chip stacked body and the wiring substrate via a wiring.

A method of manufacturing a semiconductor chip stacked body, according to a third aspect of the invention, having a plurality of chip sealing bodies which are stacked and conductively connected mutually, and a wiring substrate which mounts the plurality of chip sealing bodies thereon, each of the chip sealing body including a semiconductor chip having a semiconductor integrated circuit, a pad and a conductive connecting material, a die attach film with a resin sealing function, and a sealing resin, the die attach film and the sealing resin sealing the semiconductor chip, comprises:

a step of dicing a semiconductor wafer, which has semiconductor integrated circuits and pads, by using a dicing tape, into individual pieces to form the plurality of semiconductor chips;

a step of forming a plurality of chip sealing bodies by mounting the semiconductor chips obtained by the dicing step in predetermined positions on the die attach film, connecting the pads to each other by the conductive connecting material respectively, sealing the semiconductor chips and the conductive connecting materials located higher the die attach film with the sealing resin, and then dicing a resultant structure into individual pieces;

a step of forming a chip stacked body by stacking the plurality of chip sealing bodies, and then connecting conductively end portions of conductive connecting materials, which are exposed from surfaces of the plurality of chip sealing bodies, by a conductive bonding wire mutually; and a step of mounting the chip stacked body on the wiring substrate, and then connecting the chip stacked body and the wiring substrate via a wiring.

According to the present invention, improvement of product quality and simplification of manufacturing steps can be achieved by applying a structure and steps that allow a high-density packaging.

Other features and advantages may be apparent from the following detailed description, the accompanying drawings and the claims.

DETAILED DESCRIPTION

Exemplary embodiments for carrying out the present invention will be explained with reference to the drawings hereinafter.

First Embodiment

Figure 1:
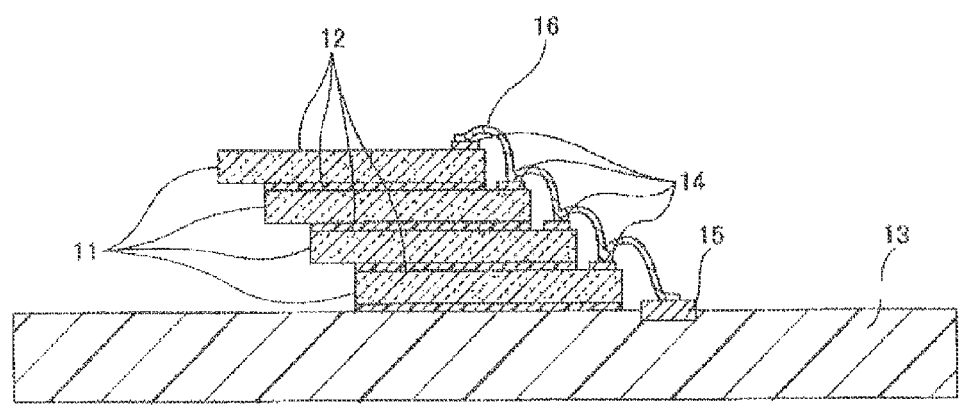
FIG. 1 is a view showing stacked chips in the related art.
Figure 2:
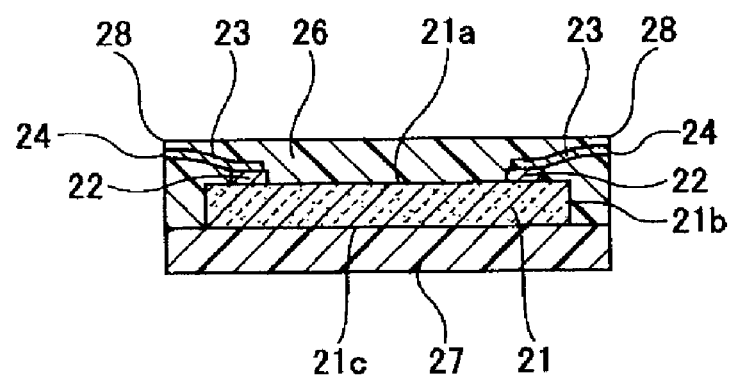
FIG. 2 is a view showing a diced chip sealing body 25 according to a first embodiment of the present invention.

FIG. 2 is a view showing a diced chip sealing body 25 according to a first embodiment of the present invention. A conductive connecting material 23 is connected to pads 22 of a semiconductor chip 21 respectively, and the whole surface of the semiconductor chip 21 and the conductive connecting materials 23 are sealed with a resin except top end faces 24 of the end portion of the conductive connecting materials 23 on the external device side, so that the chip sealing body 25 is formed. An integrated circuit surface 21a and side surfaces 21b of the semiconductor chip 21 are sealed with an insulating resin 26, and a back surface 21c of the semiconductor chip 21 is sealed with an insulating resin 27. As the insulating resins 26, 27, the material such as an epoxy-based resin, or the like, for example, can be employed. Also, the insulating resin 27, the die attach film having both functions of insulation and adhesion can be employed. When the die attach film is employed, the back surface of the semiconductor chip can be sealed with the resin and also the step of pasting an adhesive film for the stack, coating an adhesive agent, or the like can be omitted in the step of stacking the chip sealing body after the dicing. As a result, simplification of the steps can be achieved.

Advantages of the First Embodiment

A projected area in the stacking direction when the semiconductor chips are stacked in multiple stages to from a semiconductor chip stacked body can be brought close to a size of the semiconductor chip. Also, a bonding wire to be provided along the side surface of the chip sealing body can be set to the shortest length. As a result, the electrical characteristics of the semiconductor chip stacked body can be improved.

Variation of the First Embodiment

A variation of the first embodiment of the present invention shows an example of the chip sealing body that is characterized in that corner portions of the diced chip sealing body have a chamfer surface, i.e., a so-called bevel shape, respectively.

Figure 3:
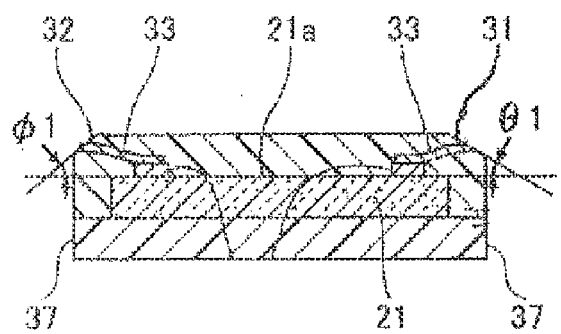
FIG. 3 is a view showing a chip sealing body in which chamfer surfaces 31 and 32 are formed at corner portions of the chip sealing body according to a variation of the first embodiment of the present invention.

FIG. 3 is a view showing a chip sealing body in which chamfer surfaces 31 and 32 are formed at corner portions of the chip sealing body according to the variation of the first embodiment of the present invention. The chamfer surfaces 31 and 32 are formed at corner portions 28 of the chip sealing body 25 in above FIG. 2, and constitute flat planes to have an angle θ1 and an angle φ1 to the integrated circuit surface 21a respectively. In response to design conditions of a shape of a conductive connecting material 33 (for example, the bonding wire) in the stacked state of the chip sealing bodies, an angle θ1 and an angle φ1 may be set to 30 degree, 45 degree, 60 degree, or the like, for example. An area of the top end surface at the end portion of the conductive connecting material 33, which is exposed from the insulating resin, may be set wider by changing an inclination angle of the chamfer surface with respect to the longitudinal direction of the conductive connecting material 33. An angle θ1 and an angle φ1 may be set to a same value unless particular conditions are imposed.

Advantages of the Variation of the First Embodiment

When the chip sealing body is stacked, the advantage of improving the electrical characteristics becomes conspicuous. Since an area of the top end surface of the end portion of the conductive connecting material 33 (for example, bonding wire) is widened by forming the chamfer surface, the chip sealing bodies can be conductively connected in the good conditions and also the electrical characteristics can be improved. Also, even through an extension of a conductive bonding wire, or the like is caused by the crush deformation, or the like when the conductive bonding wire is connected to the connection location of the top end surface of the conductive connecting material 33, such extension can be still held in depressed spaces that are produced by the chamfer surfaces 31, 32 respectively. Therefore, the deformed portion of the conductive bonding wire never protrudes from a side surface 37 of the chip sealing body. As a result, the dimensional advantage that is capable of keeping an outer dimension of the package within a predetermined value can be achieved.

Another Variation of the First Embodiment

Figure 4:
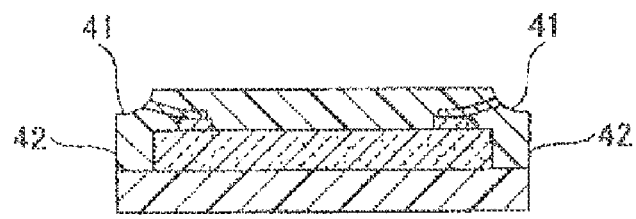
FIG. 4 is a view showing a chip sealing body in which concavely curved surfaces 41 are formed at corner portions of a chip sealing body according to another variation of the first embodiment of the present invention.

FIG. 4 is a view showing a chip sealing body in which concavely curved surfaces 41 are formed at corner portions of a chip sealing body according to another variation of the first embodiment of the present invention.

Advantages of Another Variation of the First Embodiment

The concavely curved surface can constitute a space area that is larger than that provided by the flat chamfer surface. Therefore, even when the bonding wire is deformed and extended at the connection location between the conductive connecting material and the bonding wire, the deformed portion of the conductive bonding wire never protrudes from a side surface 42 of the chip sealing body. As a result, an outer dimension of the package can be kept within a predetermined dimension with good precision.

Further Variation of the First Embodiment

Further variation of the first embodiment of the present invention shows a chip sealing body in which chamfer surfaces are formed at upper and lower corner portions of the chip sealing body respectively.

Figure 5:
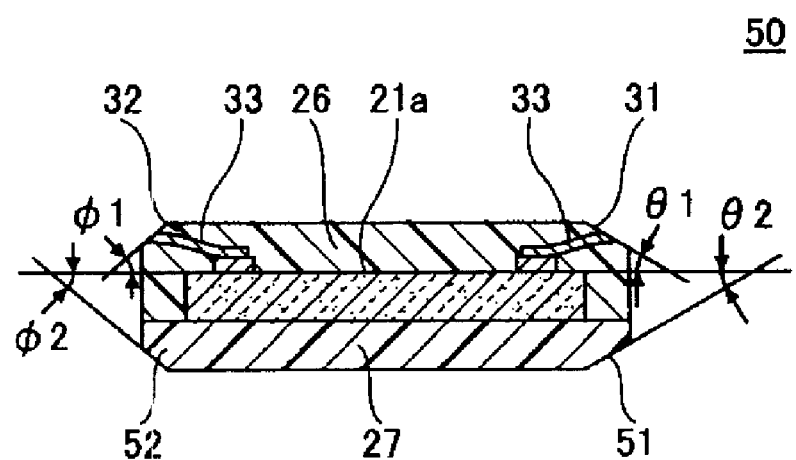
FIG. 5 is a view showing a chip sealing body 50 in which chamfer surfaces are formed at upper and lower corner portions according to further variation of the first embodiment of the present invention.

FIG. 5 is a view showing a chip sealing body 50 in which chamfer surfaces are formed at upper and lower corner portions according to further variation of the first embodiment of the present invention. In addition to the chamfer surfaces 31 and 32 of the chip sealing body shown in above FIG. 3, chamfer surfaces 51, 52 are provided to corner portions of the insulating resin 27 located on the opposite side to the integrated circuit surface. Angles of the chamfer surfaces 51 and 52 to the integrated circuit surface 21a are set to $\theta 2$ and $\phi 2$ respectively.

Advantages of Further Variation of the First Embodiment

In such a configuration that the chip sealing bodies 50 each having the chamfer surfaces at such upper and lower corner portions are stacked, a space located around the stacked areas can be kept widely when the conductive bonding wire is connected to the exposed end surface of the conductive connection material. Therefore, the connection operation of the bonding tool can be smoothly done. As a result, the bonding step can be simplified and a product quality can be improved. Also, even when the chamfer surface is formed as the concavely curved surface, the similar advantage can be achieved.

Second Embodiment

A second embodiment of the present invention shows a semiconductor chip stacked body in which a plurality of chip sealing bodies, conductive bonding wires, and a wiring substrate are sealed with a resin.

Figure 6:
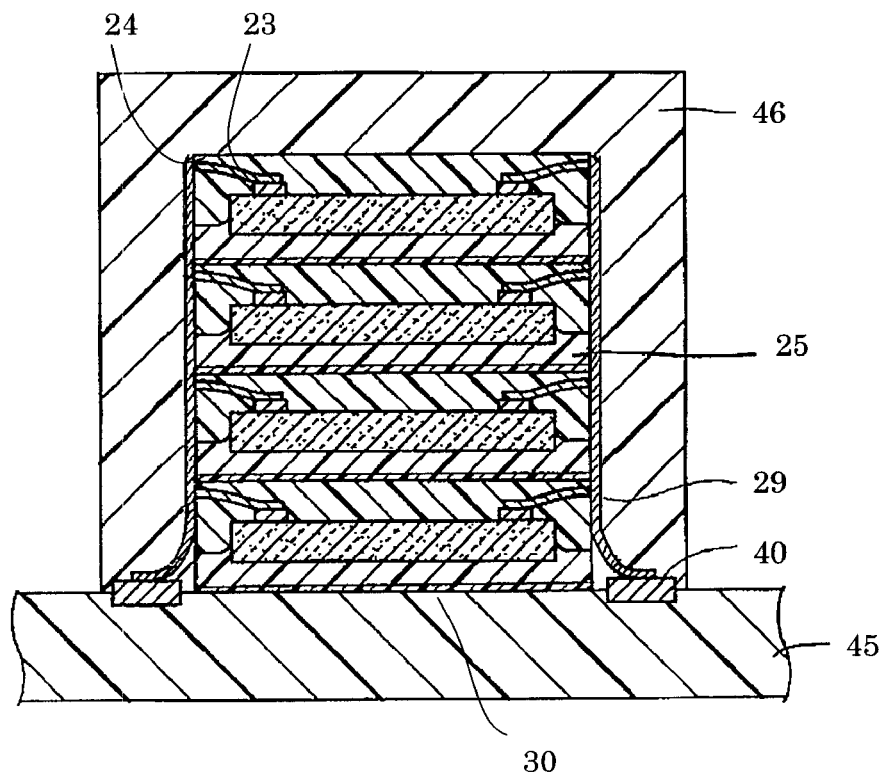
FIG. 6 is a view showing a semiconductor chip stacked body 20 according to a second embodiment of the present invention.

FIG. 6 is a view showing a semiconductor chip stacked body 20 according to a second embodiment of the present invention. A plurality of chip sealing bodies 25 are stacked, and end portions 24 of the conductive connecting materials 23 are connected by a bonding wire 29 respectively, so that a chip stacked body is formed. The chip stacked body is put on an adhesive layer 30 on a wiring substrate 45, and the end portion of the bonding wire 29 is connected to connection terminals 40 of the wiring substrate 45 respectively. The chip stacked body, the connection terminals on the wiring substrate, and the wiring substrate are sealed with an insulating resin 46, whereby the semiconductor chip stacked body 20 is formed.

Advantages of the Second Embodiment

According to the formation of the semiconductor chip stacked body 20 shown in FIG. 6, a projected area in the stacking direction when the semiconductor chips are stacked in multiple stages can be brought close to a size of the semiconductor chip. Also, the bonding wire provided along the side surface of the chip sealing body can be set to the shortest length. As a result, the electrical characteristics of the semiconductor chip stacked body can be improved.

Application Example 1 of the Second Embodiment

Figure 7:
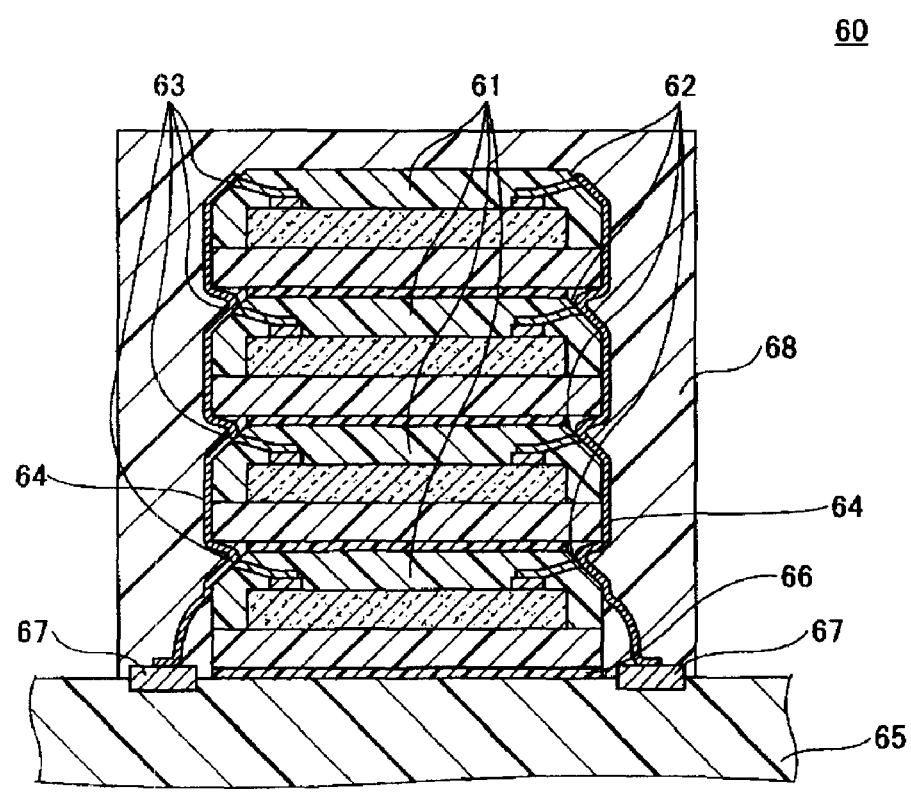
FIG. 7 is a view showing a semiconductor chip stacked body 60 according to an application example 1 of the second embodiment of the present invention.

FIG. 7 is a view showing a semiconductor chip stacked body 60 according to an application example 1 of the second embodiment of the present invention. A plurality of chip sealing bodies 61 are stacked, and end portions 63 of the conductive connecting materials being exposed from respective chamfer surfaces 62 at the corner portions are connected by a bonding wire 64 respectively, so that a chip stacked body is formed. The chip stacked body is put on an adhesive layer 66 on a wiring substrate 65, and the end portion of the bonding wire 64 is connected to connection terminals 67 of the wiring substrate 65 respectively. The chip stacked body, the connection terminals on the wiring substrate, and the wiring substrate are sealed with an insulating resin 68, whereby the semiconductor chip stacked body 60 is formed.

As the wiring substrate 65, a wide variety of wiring substrates such as the multilayer wiring substrate made of the organic material such as an epoxy resin, or the like, the semiconductor substrate composed mainly of silicon, and the like can be employed.

Advantages of the Application Example 1 of the Second Embodiment

According to the formation of the semiconductor chip stacked body 60 shown in FIG. 7, a projected area in the stacking direction when the semiconductor chips are stacked in multiple stages can be brought close to a size of the semiconductor chip. Also, the bonding wire provided along the side surface of the chip sealing body can be set to the shortest length. As a result, the electrical characteristics of the semiconductor chip stacked body can be improved.

Application Example 2 of the Second Embodiment

An application example 2 of the second embodiment of the present invention shows a semiconductor chip stacked body, in which two pairs of chip sealing bodies are stacked to oppose their chamfer surfaces to each other.

Figure 8:
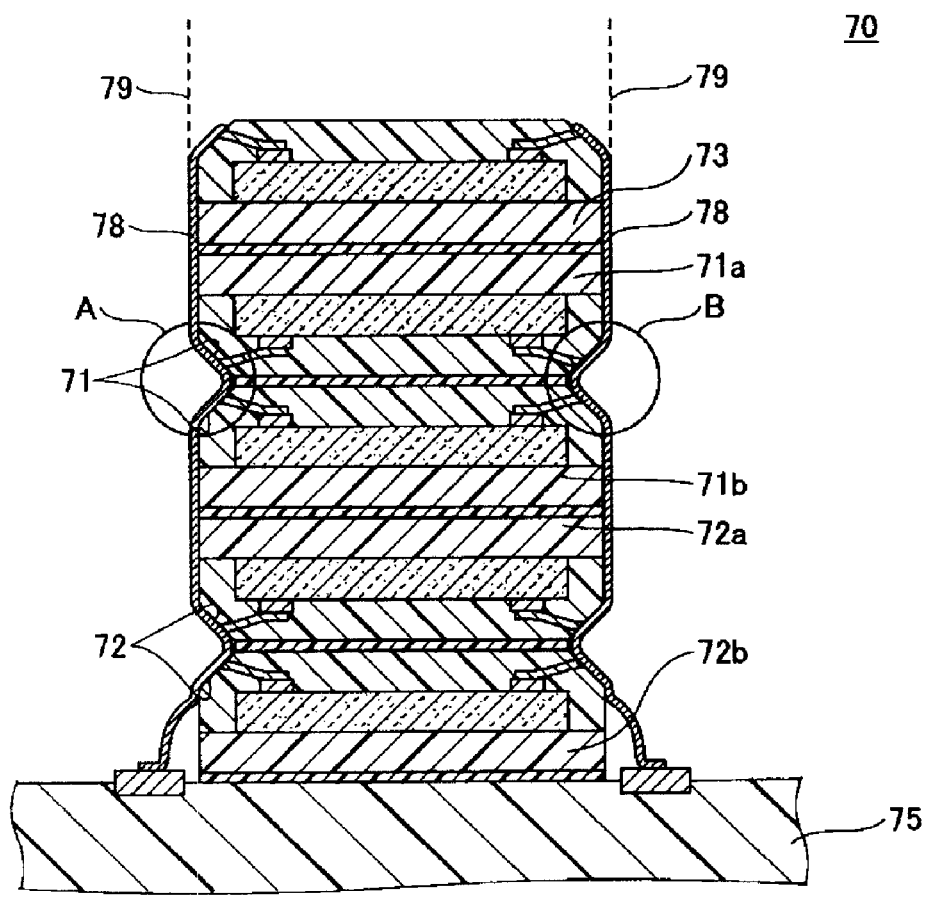
FIG. 8 is a view showing a semiconductor chip stacked body 70, in which two pairs of a chip sealing body and another chip sealing body are stacked to oppose their chamfer surfaces to each other, according to an application example 2 of the second embodiment of the present invention.

FIG. 8 is a view showing a semiconductor chip stacked body 70, in which two pairs of a chip sealing body and another chip sealing body are stacked to oppose their chamfer surfaces to each other, according to an application example 2 of the second embodiment of the present invention. The semiconductor chip stacked body 70 includes a plurality of chip sealing bodies 71a and 71b whose chamfer surfaces 71 are opposed to each other, a plurality of chip sealing body 72a and 72b whose chamfer surfaces 72 are opposed to each other, and another one chip sealing body 73. Respective chip sealing bodies are stacked and connected conductively to constitute the chip stacked body, and respective chip stacked bodies are stacked and mounted on a wiring substrate 75 to constitute the semiconductor chip stacked body 70. In this case, for convenience of explanation, a resin for sealing the overall semiconductor chip stacked body is omitted from FIG. 8.

Figure 9:
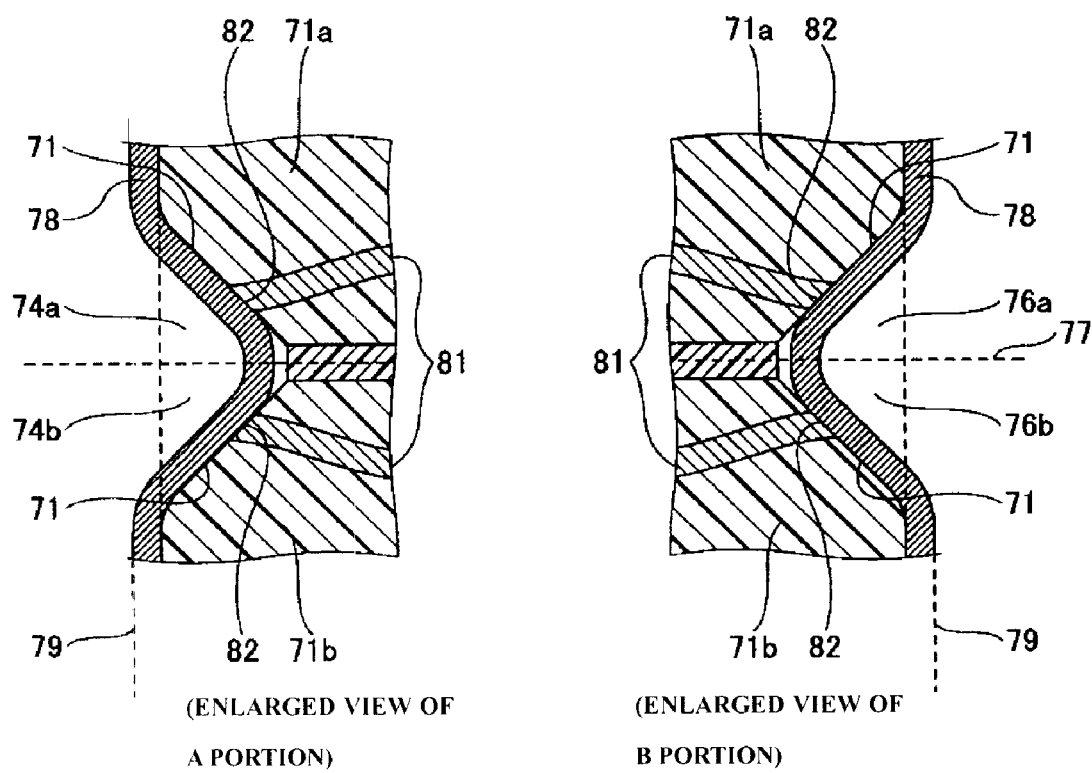
FIG. 9 is enlarged views of an A portion and a B portion in FIG. 8.

FIG. 9 is enlarged views of an A portion and a B portion in FIG. 8. Spatial shapes 74a and 76a, which are made by the chamfer surface 71 of the chip sealing body 71a respectively, and spatial shapes 74b and 76b, which are made by the chamfer surface 71 of the chip sealing body 71b respectively, possess planar symmetry with respect to a stacked surface 77 as a symmetric place between the chip sealing body 71a and the chip sealing body 71b. In this case, respective chamfer surfaces may be set not to possess planar symmetry with respect to the integrated circuit surface if no trouble is caused in the operation of the bonding tool in the conductive connection, etc.

In FIG. 8 and FIG. 9, such a state is shown that the bonding wire is provided to contact the side surfaces of the chip sealing bodies 71a and 71b. But the bonding wire may not always be provided to contact the side surfaces.

Advantages of the Application Example 2 of the Second Embodiment

Since the chip sealing bodies to the corner portions of which the chamfer surface is provided are stacked, a space needed around the connecting portion of the chip sealing body can be kept wider when the conductive bonding wire is connected. Therefore, the operation of the bonding tool can be done smoothly, and simplification of steps and improvement of a product quality can be achieved. Also, in FIG. 9, even though an extension is caused due to the deformation at a connected location 82 between a bonding wire 78 for the conductive connection and the conductive connecting material 81, the spaces 74a, 74b and the spaces 76a, 76b produced by the chamfer surfaces 71 can contain such extended portion therein respectively. As a result, the deformed portion of the conductive bonding wire never protrudes from a side surface 79 of the chip sealing body, and also the dimensional advantage that is capable of keeping an outer dimension of the package within a predetermined value can be achieved.

Application Example 3 of the Second Embodiment

An application example 3 of the second embodiment of the present invention shows another semiconductor chip stacked body, in which two pairs of chip sealing bodies are stacked to oppose their chamfer surfaces to each other.

Figure 10:
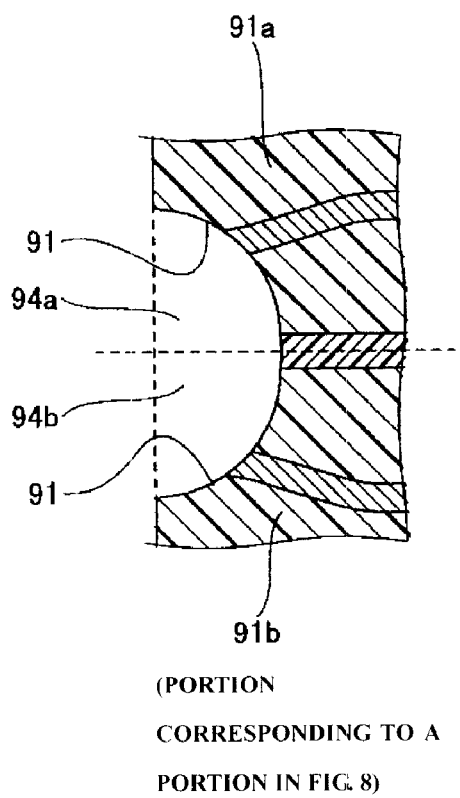
FIG. 10 is views showing portions of the semiconductor chip stacked bodies whose chamfer surfaces are formed as a concavely curved surface respectively, which correspond to an A portion and a B portion in FIG. 8.
Figure 10:
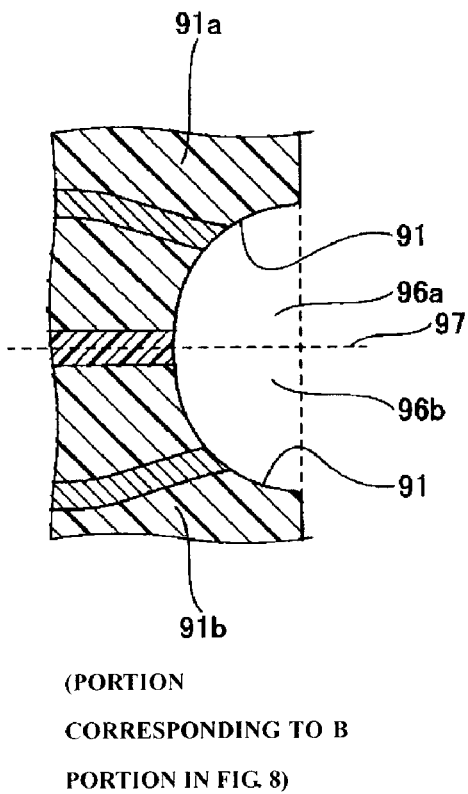

FIG. 10 is views showing portions of the semiconductor chip stacked bodies whose chamfer surfaces are formed as a concavely curved surface respectively, which correspond to an A portion and a B portion in FIG. 8. FIG. 10 shows a state prior to the conductive connection of the conductive bonding wire. Spatial shapes 94a and 96a, which are made by a chamfer surface 91 of a chip sealing body 91a respectively, and spatial shapes 94b and 96b, which are made by the chamfer surface 91 of a chip sealing body 91b respectively, possess planar symmetry with respect to a stacked surface 97 as a symmetric place between the chip sealing body 91a and the chip sealing body 91b. In this case, respective chamfer surfaces may be set not to possess planar symmetry with respect to the integrated circuit surface if no trouble is caused in the operation of the bonding tool.

Advantages of the Application Example 3 of the Second Embodiment

In the case of the application example 3 in which the chamfer surface constitutes the concave surface, the advantage in the application example 2 can be achieved and the further wider space can be kept in contrast to the case where the chamfer surface constitutes the flat surface in the application example 2. Therefore, the advantage in the application example 2 can be further enhanced.

Third Embodiment

The invention according to a third embodiment of the present invention shows a method of manufacturing a semiconductor chip stacked body.

Figure 11:
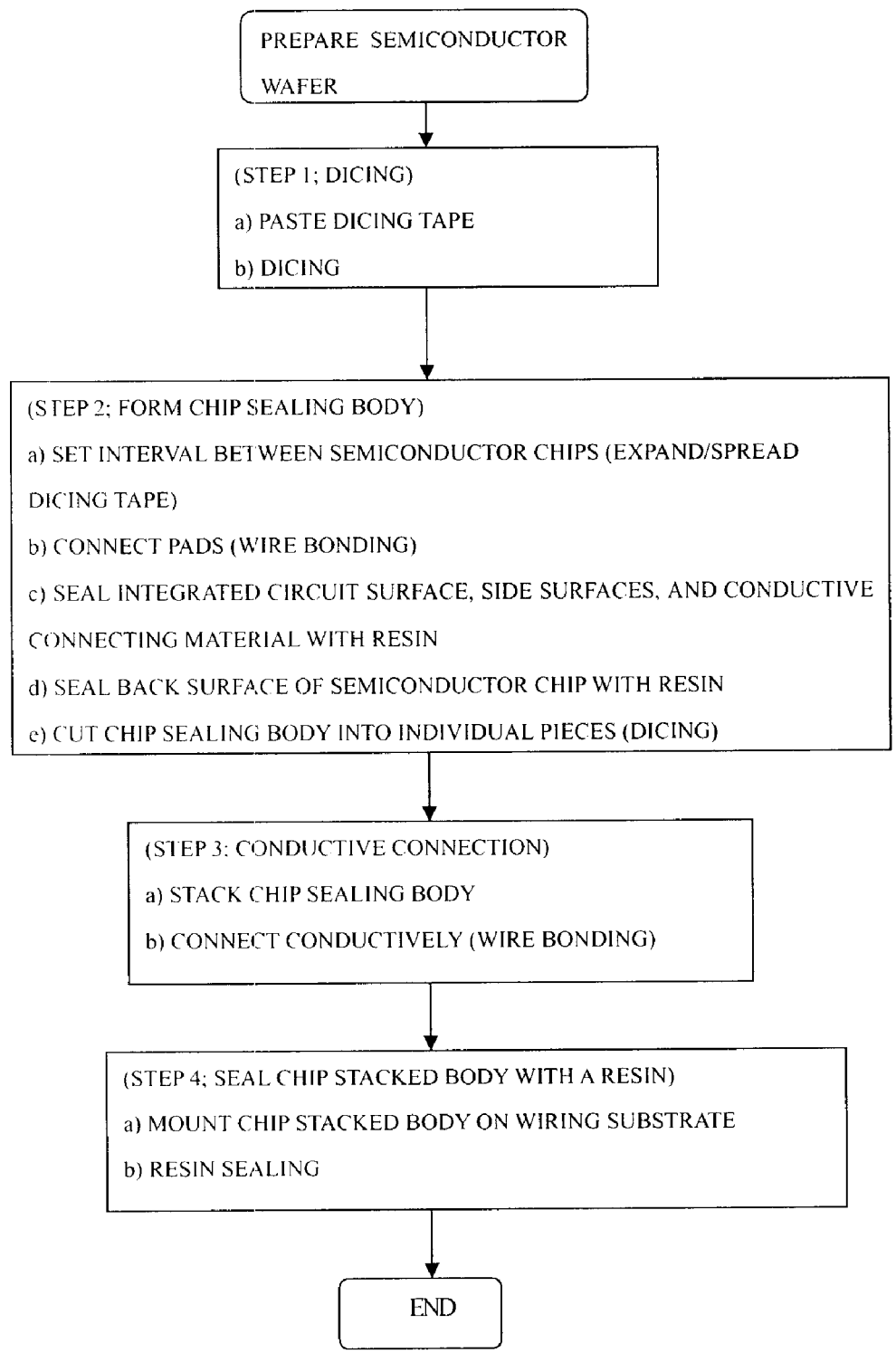
FIG. 11 is a view showing steps of the method of manufacturing the semiconductor chip stacked body according to the third embodiment of the present invention.

FIG. 11 is a view showing steps of the method of manufacturing the semiconductor chip stacked body according to the third embodiment of the present invention. Steps in the manufacturing method in FIG. 11 will be explained with reference to FIG. 12A to FIG. 14B, which illustrate modes of the product in respective manufacturing steps, hereunder.

(Step 1; Dicing)

Figure 12A:
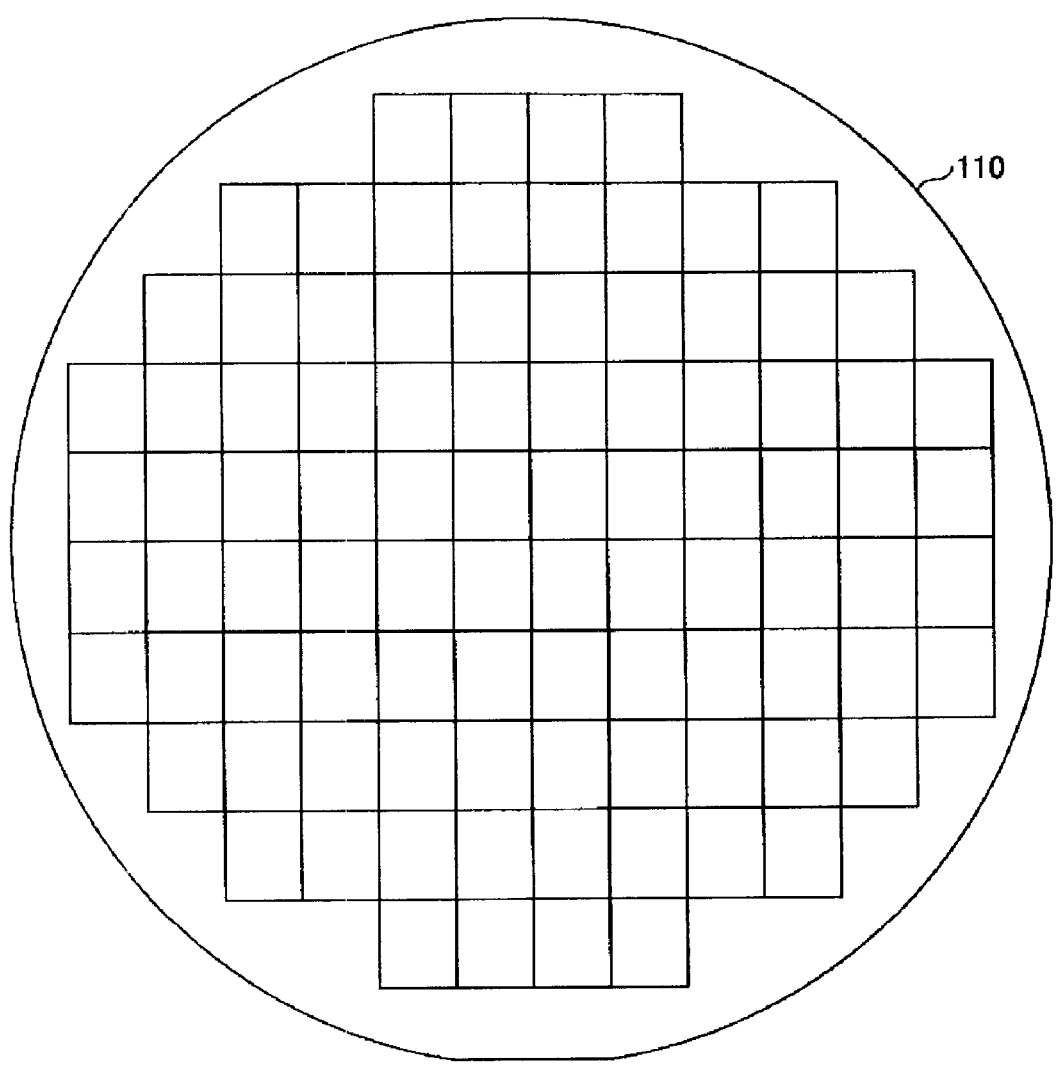
FIG. 12A is a view showing a semiconductor wafer 110 that is to be prepared.

FIG. 12A is a view showing a semiconductor wafer 110 that is to be prepared. A dicing tape is paste on the semiconductor wafer 110 whose outer diameter is 6 inch, 8 inch, or 12 inch, then the wafer is loaded on the dicer device, and then the wafer is cut into individual semiconductor chips. A thickness of the semiconductor wafer 110 is set to 50 µm, for example. The semiconductor wafer 110 is processed into a predetermined dimension in answer to the design conditions of a package product.

Figure 12B:
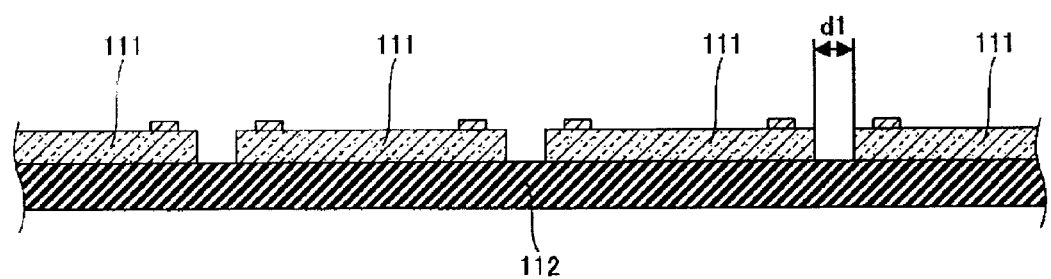
FIG. 12B is a view showing a state that the semiconductor wafer 110 is separated into individual semiconductor chips 111 by the dicer device.

FIG. 12B is a view showing a state that the semiconductor wafer 110 is separated into individual semiconductor chips 111 by the dicer device (not shown). At this time, a dicing tape 112 is not cut away, and can hold individual semiconductor chips 111 by an adhesive power of the tape in a state that these chips are arranged at an interval of a cutting margin d1 for the blade of the dicer device. This cutting margin d1 for the blade is set to 50 µm, for example.

In the resin sealing for the chip sealing body used in the chip stacked body of the present invention, the sufficient resin sealing is needed to ensure the mutual insulating property of the semiconductor chips. In particular, a sufficient thickness of the insulating material is needed on the side surface of the semiconductor chip. Therefore, the present invention provides a means for setting a sufficient separation interval between the semiconductor chips, in addition to the cutting margin d1.

(Step 2; Formation of the Chip Sealing Body)

In step 2-a), in the setting of an interval between the semiconductor chips, a separation interval between the semiconductor chips is expanded by spreading the dicing tape outwardly in the radial direction while holding its peripheral portion by the dicing ring, i.e., by expanding the dicing tape. This expanding can be applied by fitting the dicing tape, which is held on the dicing ring, onto the expander machine. Normally a separation interval between the semiconductor chips is set to 100 µm to 200 µm, and also this separation interval may be set wider, e.g., 100 µm, according to the sealing conditions.

In step 2-b), in the pad connection, the pads on the semiconductor chips are connected by using the conductive connecting material to form the connection portion for the conductive connection between the chip sealing bodies.

Figure 12C:
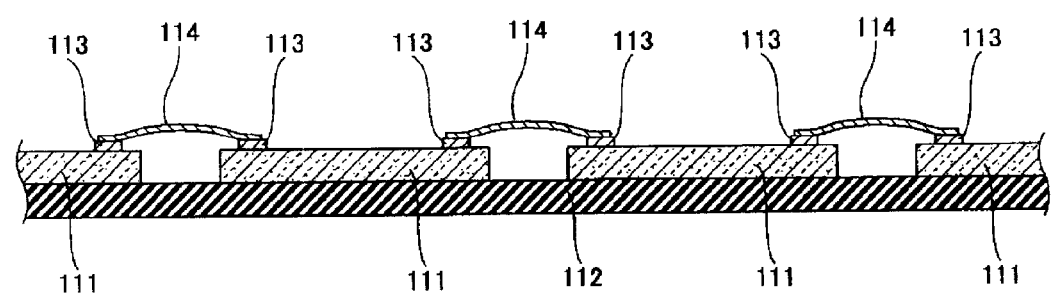
FIG. 12C is a view showing the pad connection using the bonding wire as the conductive connecting material.
Figure 12D:
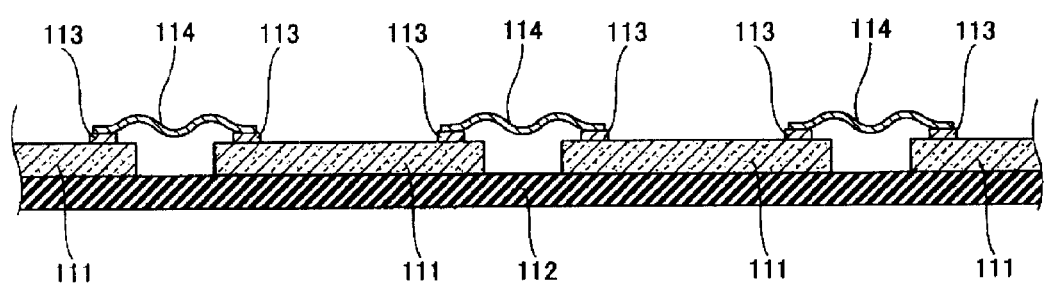
FIG. 12D, the operation of the wire bonding can be controlled such that a shape of the bonding wire when viewed from the lateral side is shaped into an English letter M.

FIG. 12C is a view showing the pad connection using the bonding wire as the conductive connecting material. Pads 113 on the semiconductor chips 111, whose interval was separated in the setting of the interval between the semiconductor chips in a) of (Step 2; Formation of the chip sealing body), are connected by a bonding wire 114 by using the bonding machine (not shown) respectively. Normally, a diameter of the wire bonding is 20 µm to 30 µm, but a larger diameter can be employed for the purpose of easy connection. A height of a vertex of the connected bonding wire is set to 40 µm from the integrated circuit surface of the semiconductor chip. As the material of the conductive connecting material, gold, aluminum, copper, tungsten, or their alloy may be employed. Also, a bonding ribbon can be employed, in addition to the bonding wire. As shown in FIG. 12C, a shape of the bonding wires being connected via the pads constitutes an upwardly gently convex curve. In this case, as shown in FIG. 12D, the operation of the wire bonding can be controlled such that a shape of the bonding wire when viewed from the lateral side is shaped into an English letter M. In other words, the bonding wire can be formed such that "the shape of the bonding wire in a plane that contains the bonding wire between the connection points in the bonding constitutes the curve that has at least one concave portion".

Here, in step 2, the sequence of a) the setting of the interval between the semiconductor chips (expansion/spread of the dicing tape) and b) the pad connection may be switched, i.e., the expansion/spread of the dicing tape may be executed after the pad connection is done. In this case, because the expansion/spread of the dicing tape is applied after the pad connection is done, the wire for connecting the pads is expanded simultaneously. Therefore, a height of the wire is lowered, and thus a height of the sealing body can be lowered.

In step 2-*c*), in the resin sealing of the integrated circuit surface, side surfaces, and the conductive connecting material, the chip sealing body is formed by using an insulating resin. The conductive connecting materials such as the bonding wire, etc. are sealed, and are fixed in positions of the connection points that are conductively connected in next step 3.

Figure 12E:
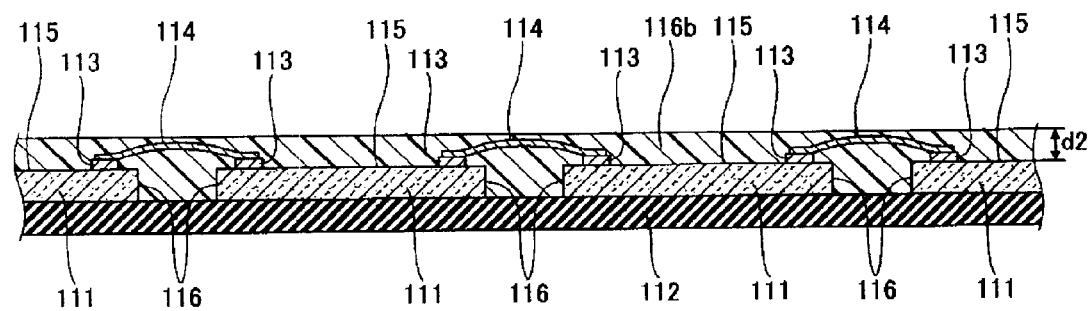
FIG. 12E is a view showing a state that the integrated circuit surface, the side surfaces, and the conductive connecting material are sealed with a resin during formation of the chip sealing body.

FIG. 12E is a view showing a state that the integrated circuit surface, the side surfaces, and the conductive connecting material are sealed with a resin during formation of the chip sealing body. Such a state is shown that the semiconductor chips being put on the dicing tape 112 are sealed with a resin, and also integrated circuit surfaces 115 and side surfaces 116 of the semiconductor chips and the bonding wires 114 of the conductive connecting material are sealed with an insulating resin 116*b*. As the material of the insulating resin, a film-like resin, a liquid resin, or the like may be employed. As the film-like resin, an epoxy resin containing silica or alumina as a filler may be employed. All the integrated circuit surface, the side surfaces, and the conductive connecting material are sealed with a resin that is softened by the heating, or the like, and then the resin is cured while keeping a bent state of the conductive connecting material. In addition, the chip resin sealing can be executed by using a polyimide resin as the liquid resin. A thickness d2 of the sealing resin is set at a level of 50 μm.

In step 2-*d*), in the resin sealing of the back surface of the semiconductor chip, a group of chip sealing bodies are formed. In order to perform the resin sealing of the back surface of the semiconductor chip, the dicing tape adhered on the back surface is peeled. The dicing tape 112 still holds respective semiconductor chips 111, which are separated from the semiconductor wafer individually, from the step 2-*a*), i.e., the step of setting the interval between the semiconductor chips, to the step 2-*c*), i.e., the step of sealing the integrated circuit surface, the side surfaces, and the conductive connecting material with the resin. The dicing tape 112 is peeled, and the back surface of the semiconductor chip is sealed with an insulating resin 117*b* shown in FIG. 12F, so that the whole surface of the semiconductor chip is sealed. As the insulating resin, a die attach film is employed.

Since the die attach film has an insulating property and an adhering function, such die attach film can be employed as the insulating resin layer in the resin sealing of the back surface of the semiconductor chip. The step of pasting the die attach film, coating the adhesive agent, or the like can be omitted in the step of stacking the chip sealing body after the chip sealing body is diced into individual pieces.

Also, as other manufacturing method, a film-like resin, a liquid resin, a tablet-like epoxy resin, or the like can be employed, like the case where the integrated circuit surface 115, the side surfaces 116, etc. are sealed by the insulating resin. A thickness d3 of the resin is set to 50 μm, for example.

In step 2-*e*), in the dicing of the chip sealing body, the chip sealing body used in the semiconductor chip stacked body is formed. Therefore, the dicing tape used to cut the chip sealing body into individual pieces is prepared.

Figure 12F:
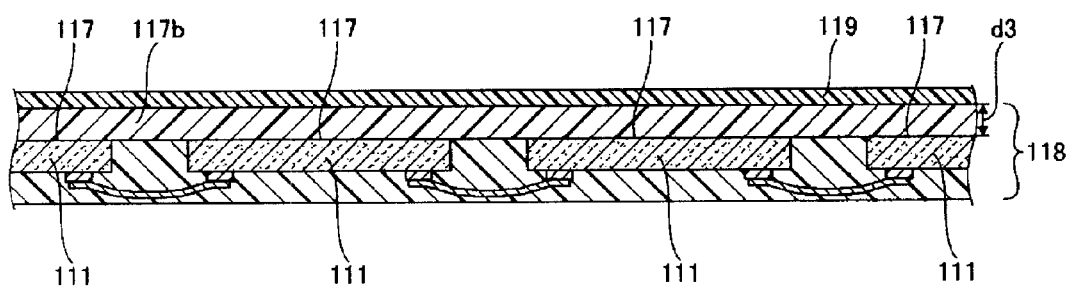
FIG. 12F is a view showing a state that the dicing tape used for the dicing of the chip sealing body is pasted on a group of chip sealing bodies that underwent the resin sealing of the back surface of the semiconductor chip.

FIG. 12F is a view showing a state that the dicing tape used for the dicing of the chip sealing body is pasted on a group of chip sealing bodies that underwent the resin sealing of the back surface of the semiconductor chip. A dicing tape 119 used to dice the chip sealing body is pasted on the back surface of a group of chip sealing bodies 118 that are sealed with a resin, and then fixed to the frame (not shown) for the dicer device.

In this case, in using the dicing tape, a dicing tape having such a structure that the die attack film with the property of insulating resin are stacked can be employed. That is, in FIG. 12F, a tape in which the die attach film 117*b* is stacked on the dicing tape 119 is prepared newly, and such tape is pasted on the back surface of a group of chip sealing bodies, the back surfaces of which are not sealed with a resin, to complete the resin sealing. Since the dicing tape in which such die attach film is stacked is employed. the step of sealing the back surface of the semiconductor chip after the dicing tape (112 shown in FIG. 12E) is peeled and the step of coating the adhesive agent for the stacking in the related art can be simplified only by peeling the portion of the stacked dicing tape 119. As a result, the step of dicing the chip sealing body in step 2-*e*) and the step of stacking the chip sealing body in step 3-*a*) can be further simplified.

In step 2-*e*), in the dicing of the chip sealing body, the chip sealing bodies used in the semiconductor chip stacked body are obtained by dicing a group of chip sealing bodies 118 into individual pieces by using the dicer device.

Figure 12G:
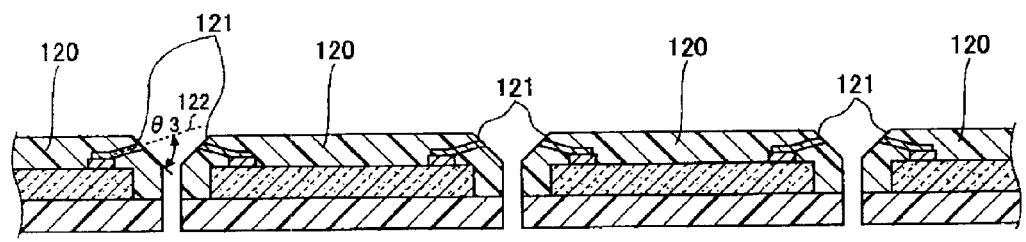
FIG. 12G is a view showing chip sealing bodies 120 that are cut into individual pieces from a group of chip sealing bodies.

FIG. 12G is a view showing chip sealing bodies 120 that are cut into individual pieces from a group of chip sealing bodies. An interval between the diced chip sealing bodies is set to 20 μm to 30 μm, for example. Then, a chamfer surface 121 is formed at the corner portions of the chip sealing bodies respectively by using the dicer device (not shown) to which the bevel cutting blade, or the like is fitted. An exposed surface of the conductive connecting material at the chamfer surface 121 has an inclination angle θ3 to a longitudinal direction 122 of the conductive connecting material. As a result, the connection surface to the conductive bonding wire can be ensured widely, and the good electrical characteristics can be provided. An angle of the chamfer surface is selected in response to the design conditions such as the designed shape of the conductive connecting material, the resin thickness, etc. Also, the dicing of the chip sealing body can be applied effectively by the method such as the dual dicing using a plurality of blades, or the like.

(Step 3; Conductive Connection)

Each chip sealing body is connected conductively by stacking the chip sealing body respectively.

In step 3-*a*), in the stacking of the chip sealing body, a plurality of sealed chips are stacked and fixed mutually. Since the die attach film is employed as the insulating film in the resin sealing of the back surface of the semiconductor chip in step 2-*d*), a plurality of sealed chips can stacked not to newly provide the adhesive layer, or the like. Also, when the insulating resin layer does not have a function of the die attach film, the die attach film, or the like is pasted as another adhesive layer, and then the chip sealing bodies are stacked.

Figure 12H:
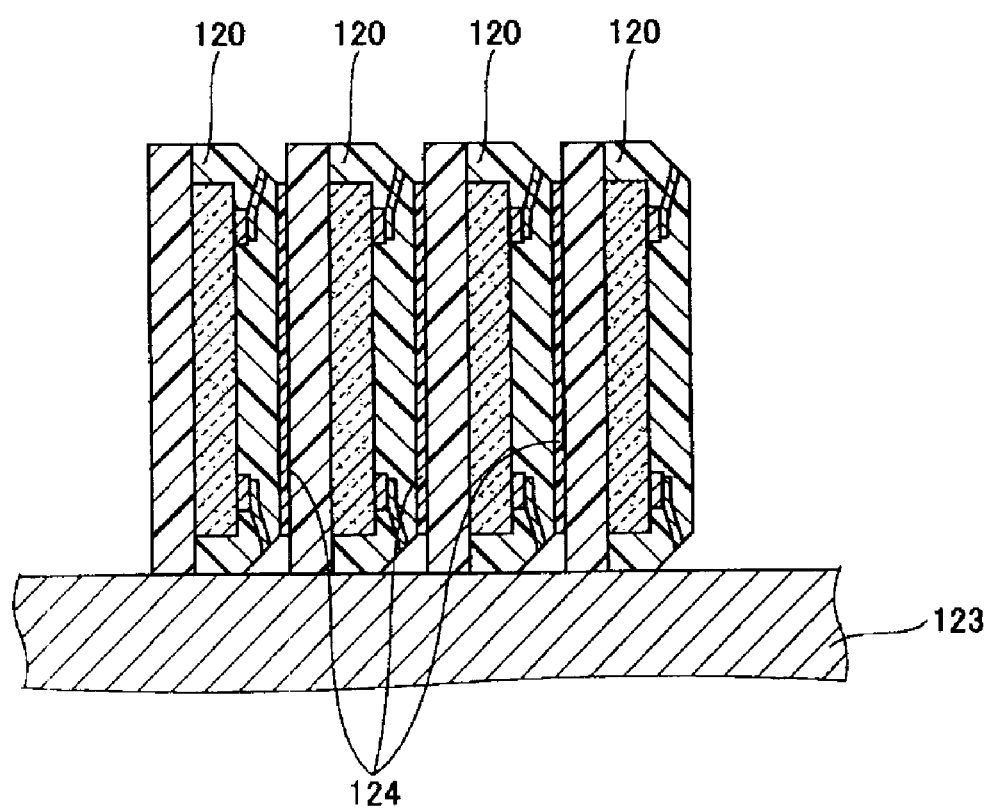
FIG. 12H is a view showing a state that the stacking of chip sealing bodies is completed when another adhesive layer is provided.

FIG. 12H is a view showing a state that the stacking of chip sealing bodies is completed when another adhesive layer is provided. A chip stacked body is formed by stacking the chip sealing bodies 120 that are diced into individual pieces in the dicing of the chip sealing body in above step 2-*e*) by utilizing a chip stacking base 123. Respective chip sealing bodies are adhered/fixed mutually in the thickness direction by using a die attach film 124 whose thickness is 10 μm to 100 μm. A dimension of one side of the chip stacked body is set to 8 mm to 10 mm.

In step 3-*b*), in the conductive connect, respective end portions of the conductive connecting material exposed from surfaces of respective chip sealed bodies are connected by the conductive bonding wire.

Figure 13:
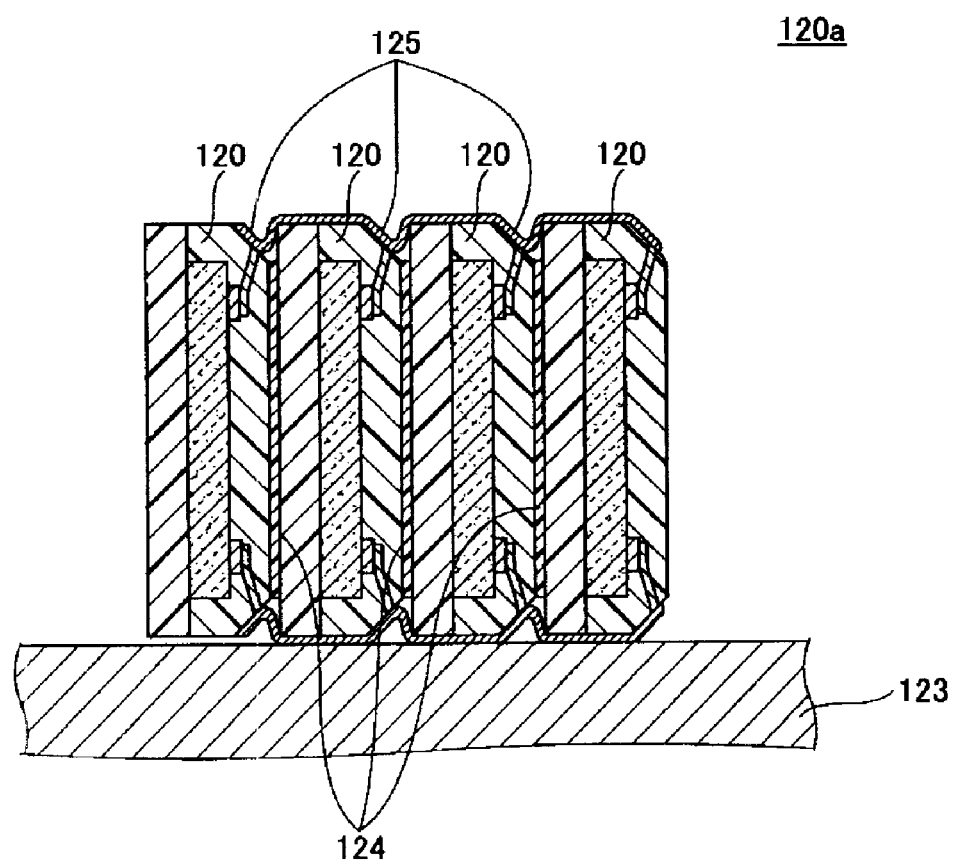
FIG. 13 is a view showing a chip stacked body 120a in a state that the conductive connection made by the wire bonding is completed.

FIG. 13 is a view showing a chip stacked body 120*a* in a state that the conductive connection made by the wire bonding is completed. As the material of the bonding wire, gold, aluminum, copper, tungsten, or their alloy may be employed. When the aluminum is employed, normally an outer diameter is set to 100 μm or less, and the bonding operation can be applied at an ordinary temperature. The end portions of the conductive bonding wires exposed from the surface of the stacked chip sealing bodies can be bonded successively and collectively.

The bonding wires for connecting the end portions of the conductive connecting materials exposed from the chamfer surfaces of the chip sealing body are provided along the chamfer surfaces. Therefore, the shape when viewed from the side surface constitutes a curve having at least one concave portion 125. The expanded portion of the bonding wire caused by the deformation at the connection location is contained in the recessed space being formed by the shape of the concave portion 125 of the bonding wire and the chamfer surface. Hence, the bonding wire never protrudes from the side surface of the chip sealing body. As a result, an outer dimension of the chip stacked body can be held at a predetermined value, and a dimensional accuracy can be increased as a package product.

(Step 4; Resin Sealing of the Chip Stacked Body)

In step 4-*a*), the chip stacked body is mount on the wiring substrate, and in step 4-*b*), the chip stacked body is sealed with a resin.

Figure 14A:
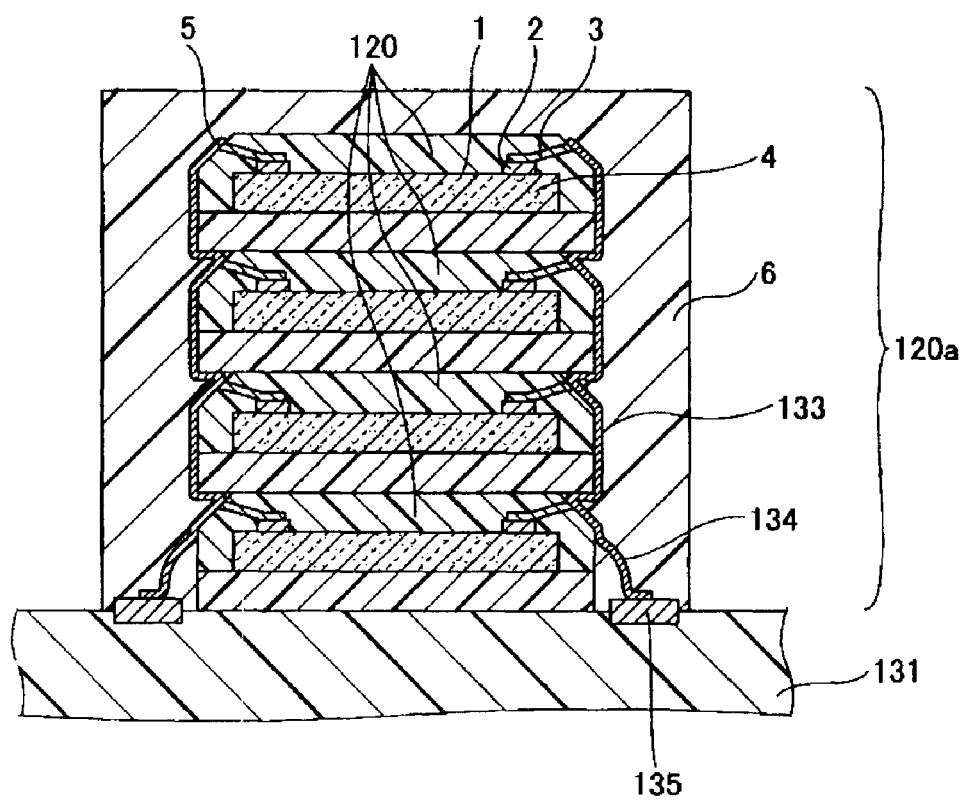
FIG. 14A is a view showing a state that the mounting of a wiring substrate on the chip stacked body is completed.

FIG. 14A is a view showing a state that the mounting of a wiring substrate on the chip stacked body is completed. A shape of the resin sealing is also shown. Here, the "mounting of the chip stacked body 120*a* on the wiring substrate" denotes the mounting method of fixing the chip stacked body 120*a*, in which a plurality of chip sealing bodies 120 are integrally stacked, on a wiring substrate 131 and then applying the conductive connection between this body and the wiring substrate. The conductive connection can be done easily by cutting the bonding wire 133 into a predetermined length, into which a distance to a connection terminal 135 of the wiring substrate 131 is estimated previously, while adjusting a length of an end portion 134 of a bonding wire 133. Since the die attach film is employed as the insulating resin, a plurality of sealing chips can be stacked without the provision of an adhesive layer, etc.

Also, in compliance with the design conditions such as the stacking order of chip sealing bodies, etc., the conductive connection may be applied between the chip sealing bodies after the chip sealing bodies are stacked sequentially on the wiring substrate.

Figure 14B:
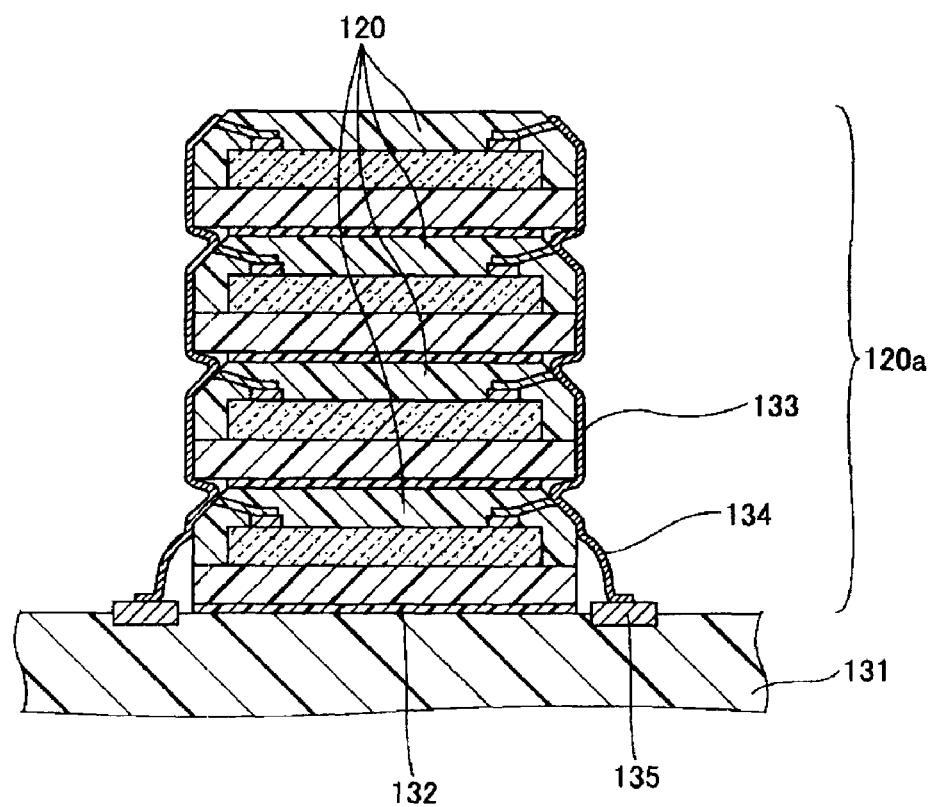
FIG. 14B is a view showing another state that the mounting of the wiring substrate on the chip stacked body is completed.

FIG. 14B is a view showing another state that the mounting of the wiring substrate on the chip stacked body is completed. The chip stacked body 120*a* in which a plurality of chip sealing bodies 120 are integrally stacked is put on the wiring substrate 131 and is fixed by an adhesive layer 132.

Here, the choice of how the integrated circuit surfaces of respective chip sealing bodies should be directed, i.e., whether the chip sealing bodies should be directed in one direction and then stacked or plural pairs of chip sealing bodies should be stacked to oppose their integrated circuit surfaces to each other, can be decided to meet the design conditions of the overall chip stacking bodies. In this case, the formation of the adhesive resin is needed individually every time when the chip stacking body whose direction is changed is stacked.

Then, the resin sealing is applied to the chip stacked body whose mounting on the wiring substrate is completed and the wiring substrate in step 4-*b*), and thus the semiconductor chip stacked body is obtained.

The foregoing FIG. 7 shows a mode in which the resin sealing is applied to the obtained semiconductor chip stacked body by the transfer molding method. Also, the resin sealing may be applied by the side fill method using the potting resin, or the like.

Advantages of the Third Embodiment

The simplification of steps and the improvement of the product quality such as the electrical characteristics, etc. can be achieved by the expansion/extension of the dicing tape and the formation of the chamfer surface.

Variation of the Third Embodiment

A variation of the third embodiment of the present invention shows another manufacturing method of a semiconductor chip stacked body. As to the chip sealing bodies constituting the semiconductor chip stacked body, the semiconductor chip stacked body can be formed by applying another method, which does not form the chamfer surface, without the deterioration of the electrical characteristics.

Figure 15A:
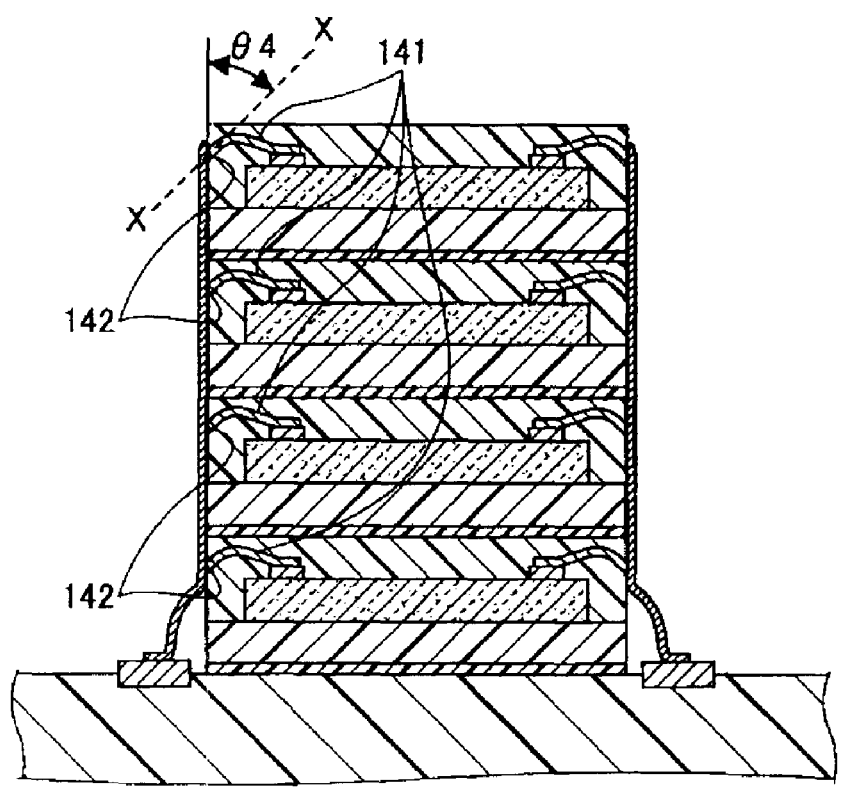
FIG. 15A is a view showing a semiconductor chip stacked body 140 formed by another manufacturing method according to a variation of the third embodiment of the present invention.

FIG. 15A is a view showing a semiconductor chip stacked body 140 formed by another manufacturing method according to a variation of the third embodiment of the present invention. As shown in FIG. 12D in step 2; Formation of the chip sealing body of the third embodiment, when the shape of the bonding wire having the concave portion in the middle of the connection pads, i.e., the so-called English letter M, is formed remarkably, the bonding wire can be conductively connected without formation of the chamfer surface at the corner portion of the chip sealing body. The reason for this is given as follows. That is, in FIG. 15A, a top end surface 142 of the end portion of a bonding wire 141 on the insulating resin surface has an inclination angle θ4 to the longitudinal direction X-X of the bonding wire, and thus the top end surface 142 of the end portion gives a wider surface like an ellipse to constitute the wide connection surface, so that the bonding in next step 3; Conductive connection can be easily and sufficiently done. In this case, as shown in FIG. 12D, the wording "English letter M" denotes that, when the shape of the bonding wire in the plane that contains the bonding wire between the connection pads is observed, the bonding wire is shaped to constitute the curve that has at least one concave portion.

Advantages of the Variation of the Third Embodiment

When the connected shape of the bonding wire as the conductive connecting material constitutes the curve that has at least one concave portion, the wide area can be ensured in the surface of the exposed end portion of the conductive connecting material not to provide the chamfer surface of the chip sealing body, and also the improvement of the electrical characteristics of the connecting portion can be achieved. Also, the simplification of the steps can be achieved.

Application Example of the Third Embodiment

An application example of the third embodiment of the present invention shows a method of manufacturing a plurality of semiconductor chip stacked bodies each having external connection terminals.

Figure 15B:
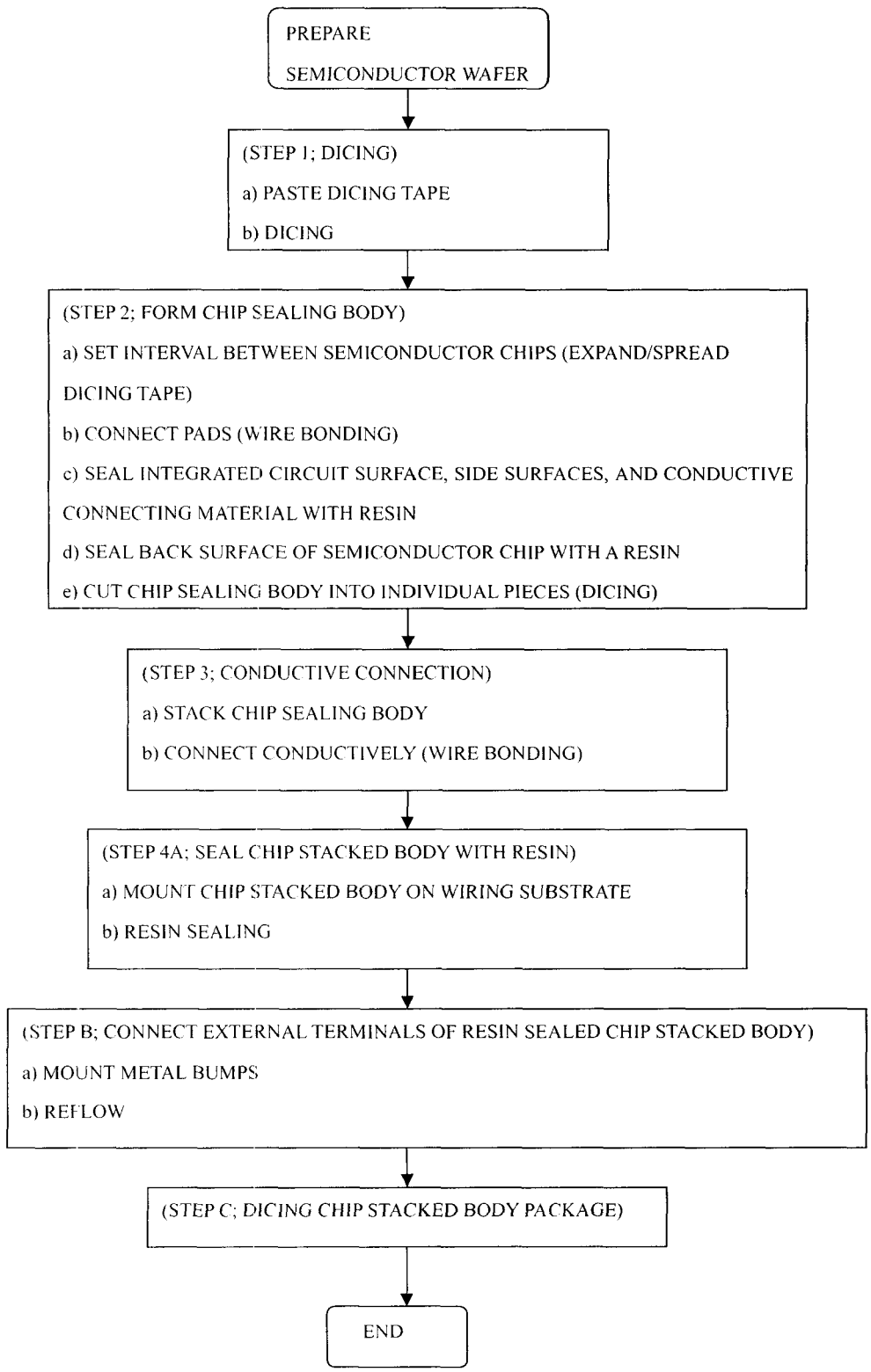
FIG. 15B is a view showing steps of a method of manufacturing semiconductor chip stacked bodies according to an application example of the third embodiment of the present invention.

FIG. 15B is a view showing steps of a method of manufacturing semiconductor chip stacked bodies according to an application example of the third embodiment of the present invention. Differences from the foregoing steps in FIG. 11 showing the manufacturing method of the third embodiment are steps subsequent to Step 4A; Resin sealing of the chip stacked body.

Figure 15C:
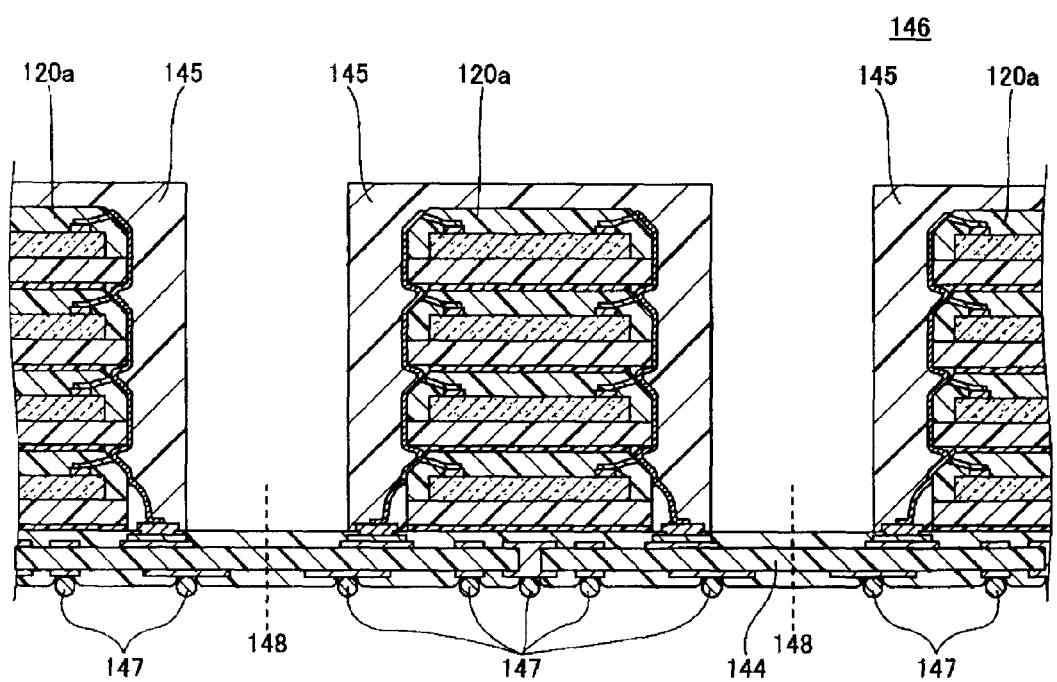
FIG. 15C is a view showing a plurality of semiconductor chip stacked bodies having external connection terminals according to the application example of the third embodiment of the present invention.

FIG. 15C is a view showing a plurality of semiconductor chip stacked bodies having external connection terminals according to the application example of the third embodiment of the present invention. Respective steps in the manufacturing method will be explained FIG. 15C hereunder. In this case, respective steps from Step 1; dicing to Step 3; conductive connection are similar to the steps shown in FIG. 11 of the third embodiment, and therefore their explanation will be omitted herein.

(Step 4A; Resin Sealing of the Chip Stacked Body)

In step 4A-a), a plurality of chip stacked bodies 120a are mounted on a common wiring substrate 144. In step 4A-b), the chip stacked bodies 120a as well as the wiring substrate 144 are sealed with an insulating resin 145. Thus, a semiconductor chip stacked body 146 that is sealed with the resin is formed.

(Step B; External Terminal Connection of the Resin Sealed Chip Stacked Body)

External connection terminals 147 such as metal bumps, or the like are connected by mounting the metal bumps in step B-a) and applying the reflow in step B-b). As the metal bumps, the material such as solder such as tin, silver, or the like, solder such as copper core ball, or the like can be chosen.

(Step C; Dicing the Chip Stacked Body Package)

The package products can be obtained by separating/cutting dicing positions 148 of the wiring substrate by means of the shearing machine, or the like.

Advantage of the Application Example of the Third Embodiment

A plurality of packages of the chip stacked body with the external connection terminals can be manufactured simultaneously. Therefore, the improvement of productivity can be achieved.

Fourth Embodiment

A fourth embodiment of the present invention is concerned with the manufacturing steps from the dicing of the chip sealing body in step 2-e) to the stacking of the chip sealing bodies in step 3-a) in FIG. 11 shown in the foregoing manufacturing method of the third embodiment. This method of manufacturing a semiconductor chip stacked body is characterized in that the die attach film having a function of the dicing tape is employed instead of the dicing tape that is to be used upon dicing a group of chip sealing bodies.

Figure 16A:
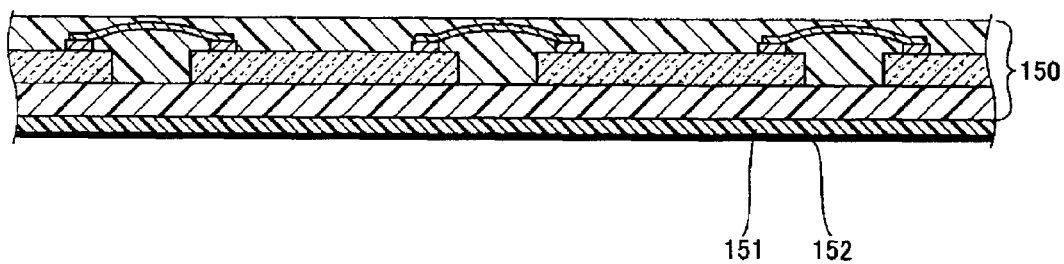
FIG. 16A is a view showing a method of manufacturing a semiconductor chip stacked body according to the fourth embodiment of the present invention.

FIG. 16A is a view showing a method of manufacturing a semiconductor chip stacked body according to the fourth embodiment of the present invention. Upon dicing a group of chip sealing bodies 150, a die attach film 151 having a function of the dicing tape is employed. An adhesive layer 152 is provided to the back surface of the die attach film 151. At a time of dicing, the chip sealing bodies 150 can be cut into individual pieces by separating completely the die attach film in stacking respective chip sealing bodies, while keeping a state that an outer layer of the die attach film 151 is still connected partially.

Advantage of the Fourth Embodiment

In the dicing/stacking of the chip sealing bodies, the process of pasting the die attach film needed in the related art and the process of pasting the dicing tape for the dicing of the chip sealing bodies can be carried out simultaneously. Therefore, the simplification of the steps can be achieved.

Fifth Embodiment

A fifth embodiment of the present invention shows another manufacturing method that is concerned with the manufacturing steps from the dicing of the chip sealing body in step 2-e) to the stacking of the chip sealing bodies in step 3-a) in FIG. 11 shown in the foregoing manufacturing method of the third embodiment. This method is characterized in that an adhesive layer is provided on the back surface of the dicing tape for a group of chip sealing bodies.

Figure 16B:
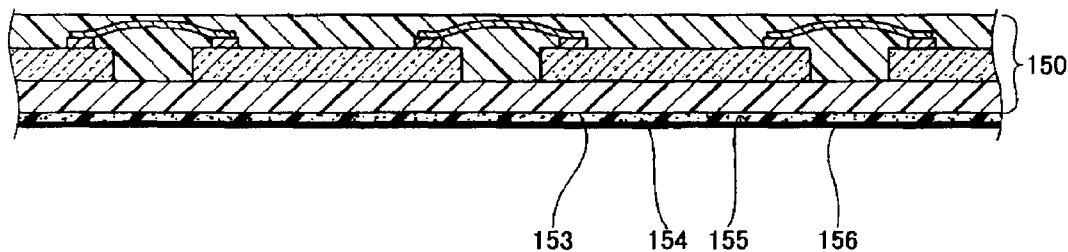
FIG. 16B is a view showing a method of manufacturing a semiconductor chip stacked body according to a fifth embodiment of the present invention.

FIG. 16B is a view showing a method of manufacturing a semiconductor chip stacked body according to a fifth embodiment of the present invention. A dicing tape 154 for individual pieces of the chip sealing bodies being pasted on the surfaces 153 of a group of chip sealing bodies 150 has an adhesive layer 156 on a surface 155 on the opposite side to the adhesive surface to the chip sealing bodies 150. A function of the die attach tape is given to the dicing tape for individual pieces of the chip sealing bodies to stack the chip sealing bodies. At a time of dicing, the chip sealing bodies 150 can be cut into individual pieces by separating completely such dicing tape in stacking respective chip sealing bodies, while keeping a state that an outer layer of the dicing tape 154 for individual pieces of the chip sealing bodies is still connected partially.

Advantage of the Fifth Embodiment

Like the advantages of the fourth embodiment with regard to the die attach film, in the dicing/stacking of the chip sealing bodies, the process of pasting the die attach film needed in the related art and the process of pasting the dicing tape for the dicing of the chip sealing bodies can be carried out simultaneously. Therefore, the simplification of the steps can be achieved.

Sixth Embodiment

A sixth embodiment of the present invention shows a semiconductor chip stacked boy being characterized in that the semiconductor chip in the lowermost layer of the chip stacked body is flip-chip mounted on the wiring substrate.

Figure 17:
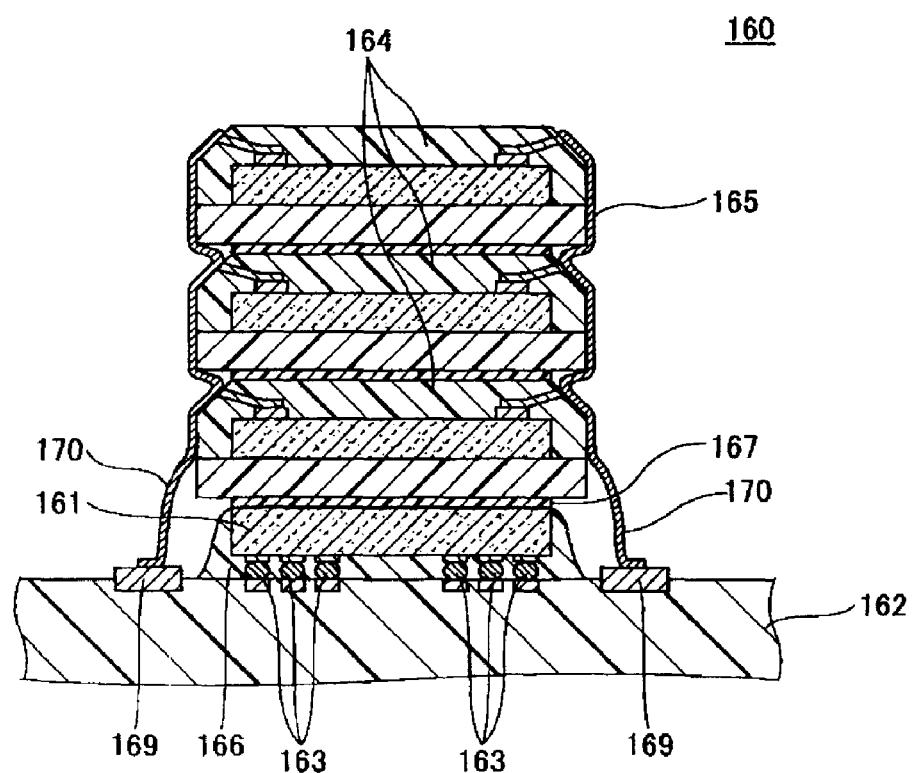
FIG. 17 is a view showing a semiconductor chip stacked body 160 according to a sixth embodiment of the present invention.

FIG. 17 is a view showing a semiconductor chip stacked body 160 according to a sixth embodiment of the present invention. A configuration and a manufacturing method will be explained as follows. Such a semiconductor chip stacked body 160 is shown that a semiconductor chip 161 in the lowermost layer opposing to a connection surface of the wiring substrate is flip-chip connected to a wiring substrate 162. The semiconductor chip 161 in the lowermost layer is flip-chip connected to the wiring substrate 162 by connection bumps 163, and the chip sealing bodies in other chip sealing bodies 164 are connected conductively mutually by a bonding wire 165 respectively. After the semiconductor chip 161 is flip-chip connected, a clearance between the semiconductor chip 161 and the wiring substrate 162 is sealed with an underfill 166. A die attach film 167 is provided onto the back surface of the semiconductor chip 161, and the chip stacked bodies of other chip sealing bodies are stacked thereon. In order to get the conductive connection between the chip stacked bodies and the wiring substrate, the bonding wire 165 provided on the side surfaces of the chip stacked bodies and connection terminals 169 of the wiring substrate 162 are connected. In providing the connection to the wiring substrate, the bonding can be done easily by cutting the bonding wire 165 into a predetermined length, into which a distance to the connection terminal 169 of the wiring substrate 165 is estimated previously, while adjusting a length of an end portion 170 of the bonding wire 165. Also, the external connection terminals can be connected to the wiring substrate. As the manufacturing method in such case, the similar method to those given after step 4A; Resin sealing of the chip stacked body in FIG. 15B shown in the method of manufacturing the semiconductor chip stacked body in the application example of the third embodiment may be employed.

Advantages of the Sixth Embodiment

Even when the semiconductor chip in the lowermost layer has multiple terminals, the semiconductor chip stacked body can be formed by connecting it to the wiring substrate. The types of the semiconductor chips that can utilize the mode of the semiconductor chip stacked body of the present invention can be expanded by combining such semiconductor chip having multiple terminals with the chip stacked bodies that are put on the upper layers, and such resultant semiconductor chip can contribute the expansion of function as the composite semiconductor device. For example, the stacking of the CPU and memory semiconductor chips of the logic circuit having multiple terminals, and the like can be realized.

Seventh Embodiment

A seventh embodiment of the present invention shows a method of manufacturing a semiconductor chip stacked body applied after the diced semiconductor chips are moved to a predetermined position of a die attach film (DAF) respectively and mounted thereon. In the above-mentioned third embodiment, the method of expanding/spreading (expand) the dicing tape to set a separation interval between the semiconductor chips. In this seventh embodiment, a means for mounting the diced semiconductor chip in a predetermined position on the die attach film (DAF) is employed.

Figure 18:
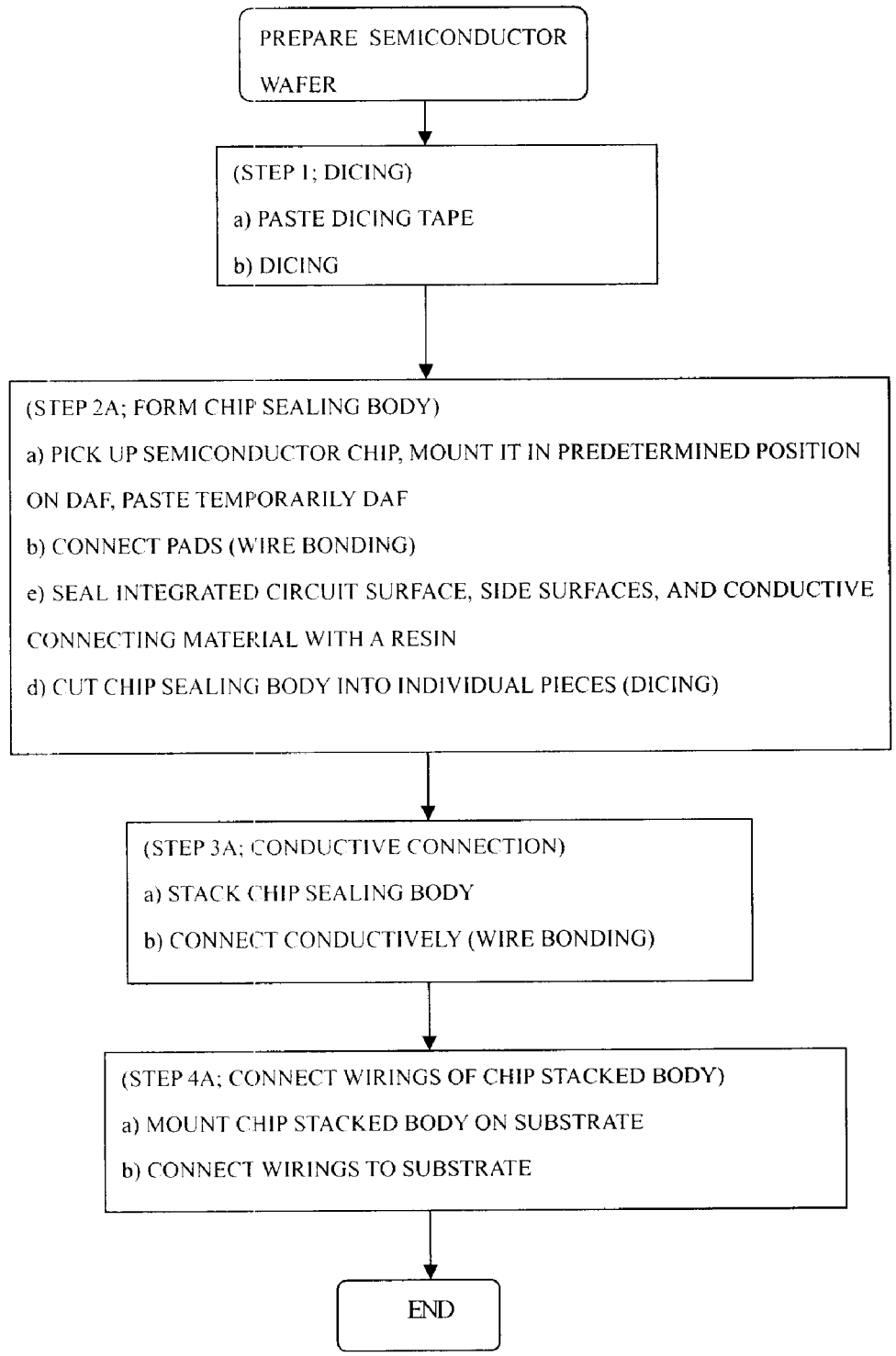
FIG. 18 is a view showing a method of manufacturing a semiconductor chip stacked body according to a seventh embodiment of the present invention.

FIG. 18 is a view showing a method of manufacturing a semiconductor chip stacked body according to a seventh embodiment of the present invention.

The manufacturing method includes respective steps of (step 1; dicing), (step 2A; form the chip sealing body), (step 3A; the conductive connection), and (step 4A; connect the wirings of the chip stacked body), and the semiconductor chip stacked body is manufactured. The manufacturing method in FIG. 18 will be explained with reference to the drawings that show the states of the semiconductor chip in respective steps in FIG. 19A to FIG. 19D.

(Step 1; Dicing)

The dicing step of obtaining individual semiconductor chips by dicing the semiconductor wafer is similar to that in the above third embodiment, and therefore their explanation will be omitted herein.

(Step 2A; a) Pick Up the Semiconductor Chip, Mount it in the Predetermined Position on DAF, Paste Temporarily DAF)

This step includes respective steps in which the picked-up semiconductor chips are mounted on predetermined positions on the DAF, the pads are connected, all semiconductor chips, etc. are sealed with a resin, and the resin-sealed chip sealing bodies are diced into individual pieces. The steps required until the chip sealing bodies are diced are shown from FIG. 19A(a) to FIG. 19C(g).

(Step 2A-a; Pick Up the Semiconductor Chip, Mount it in a Predetermined Position on DAF, Paste Temporarily DAF)

Figure 19A:
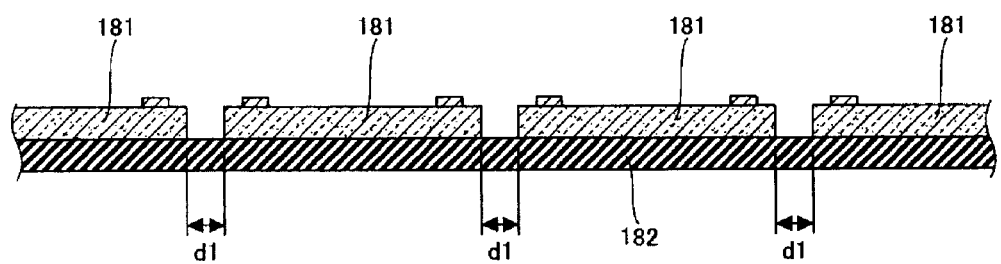
FIGS. 19A to 19D are views showing respective states in order in the manufacturing method according to the seventh embodiment.
Figure 19A:
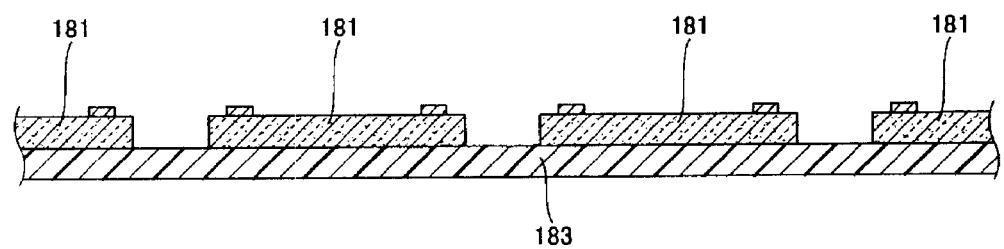
Figure 19A:
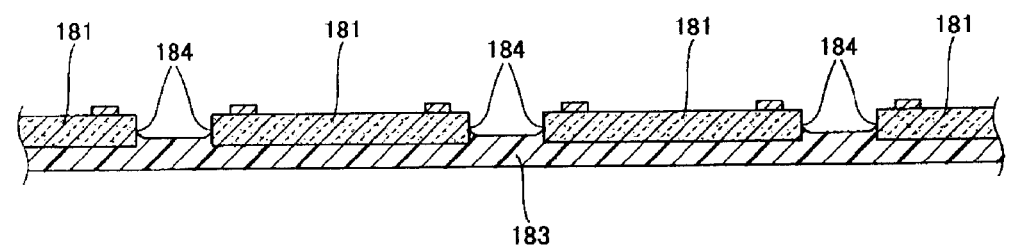

FIG. 19A(a) shows such a state that the dicing of the semiconductor wafer on the dicing tape is completed. Individual semiconductor chips 181 whose dicing is finished are put as they are on a dicing tape 182 to keep the interval d1 as a cutting margin of the die saw. The semiconductor chip 181 in such state is picked up and is mounted in a predetermined position on the newly prepared die attach film.

FIG. 19A(b) shows such a state that the semiconductor chip 181 is mounted in the predetermined position. The predetermined position on a die attach film 183 is given as the mounting position of each semiconductor chip that is calculated based on the sealing margin, which is required to seal the side surface the semiconductor chip with the resin, and the cutting margin (e.g., 25 μm to 30 μm), which is required to dice the chip sealing bodies after the sealing by the blade of the dicer device. In the mounting operation, a satisfactory accuracy of the mounting position by using a position setting mechanism equipped with the optical device.

The die attach film 183 has a function of the adhesive layer in the stacking the chip sealing bodies, and functions of the insulating property insurance and mechanical protection for the semiconductor chip as the sealing resin. The back surface side of the semiconductor chip as the surface on the opposite side to the semiconductor integrated circuit surface is sealed with the die attach film having a function of the sealing resin. As the material of the die attach film 183, for example, DF402 series manufactured by Hitachi Chemical Co., Ltd., LE5000 series manufactured by Lintec Corporation, WL-NCF series manufactured by Toray Industries, Inc., or the like is employed. As the conditions for the temporal pasting of the semiconductor chip 181, for example, a time of 10 second is required at a temperature of 80° C. to 100° C. In the sealing of the semiconductor chip, the adhesion of the sealing material at the corner portion of the semiconductor chip is particularly important, and exerts an influence on a product quality.

FIG. 19A(c) shows such a state that the semiconductor chip 181 is temporarily pasted. The resin is fluidized at a time of temporarily pasting and is adhered to a lower side surface 184 of the semiconductor chip 181, and the sealing state in which the resin is adhered surely to the semiconductor chip is formed.

(Step 2A-b; Pad Connection (Wire Bonding))

Figure 19B:
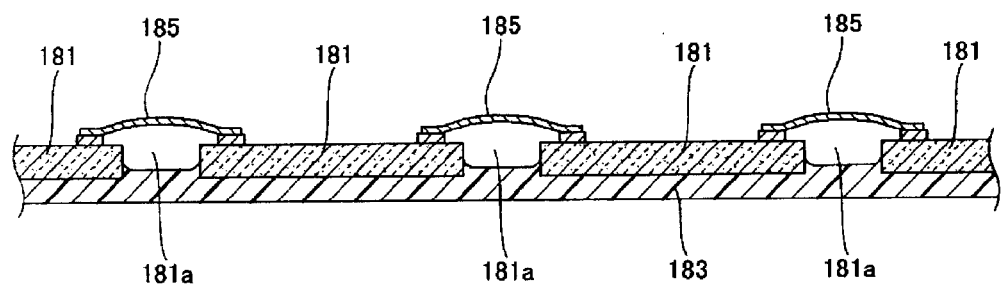
Figure 19B:
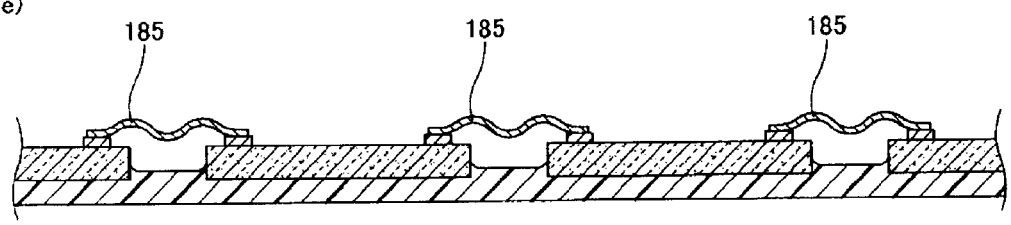
Figure 19B:
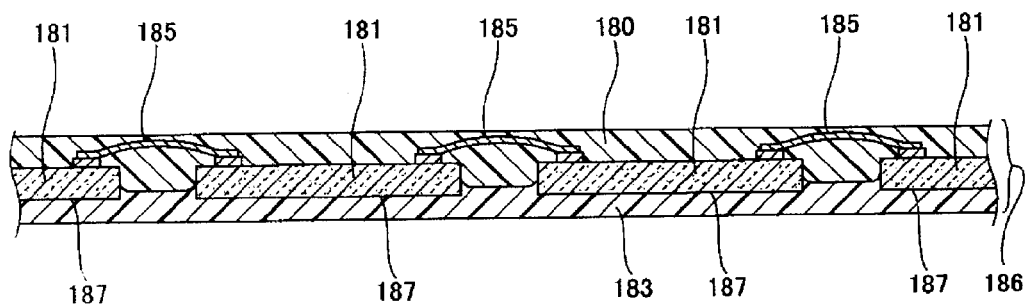

FIG. 19B(d) shows such a mode that the pads are connected. The pads are connected in such a mode that a bonding wire 185 stretches over a groove 181a that isolates respective semiconductor chips. The reason why the bonding wire 185 is provided to stretch over the groove 181a is that, in the dicing of the chip sealing body (step 2A-d (FIG. 18)) prepared two steps ahead, the bonding wire is caused to expose from the resin surface after the dicing, and is connected conductively. Since the exposed portion on the resin surface is formed as a wide surface, the bonding wire can be connected conductively with good precision (step 3A-b (FIG. 18). Also, the shape of the pad connection is not limited to the upward convex shape shown in FIG. 19B(d). The operation of the wire bonding can be controlled such that the shape of the bonding wire when viewed from the lateral side is shaped into the English letter M, for example.

FIG. 19B(e) shows the shape of the bonding wire 185 when viewed from the lateral side is shaped into the English letter M. Like FIG. 12D, the bonding wire can be formed such that "the shape of the bonding wire in the plane that contains the bonding wire between the connection points in the bonding constitutes the curve that has at least one concave portion". When such shape of the bonding wire is maintained, the connection surface of the bonding wire to the conductive material can have a wide area without the provision of the chamfer surface at the corner portion of the chip sealing body. Therefore, in executing the conductive connection while stacking the chip sealing bodies, the conductive connection can be executed easily and with high accuracy. The similar advantages can be exhibited in the above-mentioned variation of the third embodiment.

(Step 2A-c; Resin Sealing of the Integrated Circuit Surface, the Side Surfaces, and the Conductive Connecting Material)

FIG. 19B(f) shows a state that a group of chip sealing bodies 186 are formed by sealing the integrated circuit surface, the side surfaces, and the conductive connecting material with a resin. The back surface 187 and its neighborhood of the semiconductor chip 181 have already been sealed with the die attach film 183 that has a function of the resin sealing. Therefore, when the unsealed portions of the semiconductor chips and the bonding wire (commonly the conductive connecting material) are sealed with the resin, the sealing of the semiconductor chips and the bonding wire is completed.

A resin 180 used in the sealing in step 2A-c) is requested to have a physical property of low viscosity at a time of temporary pasting. This is because an angle of axis of the bonding wire to the sealed end surface must be kept at a predetermined angle to execute the conductive connection easily with good accuracy and therefore the upward convex shape, the M-shape, or the like (FIG. 19B(d)(e)) of the bonding wire must be kept at a time of resin sealing. For example, WL-NCF manufactured by Toray Industries, Inc., or the like can be employed because such material has a physical property of low viscosity at a time of temporary pasting. The explanation about the reason why an angle of the axis of the bonding wire to the sealed end surface must be kept at a predetermined angle has already made by reference to FIG. 15A in the variation of the third embodiment.

(Step 2A-d; Dicing of the Chip Sealing Body)

The chip sealing bodies used in the semiconductor chip stacked body can be obtained by cutting a group of chip sealing bodies 186 (FIG. 19B(f)) into individual pieces by means of the dicer device (not shown).

Figure 19C:
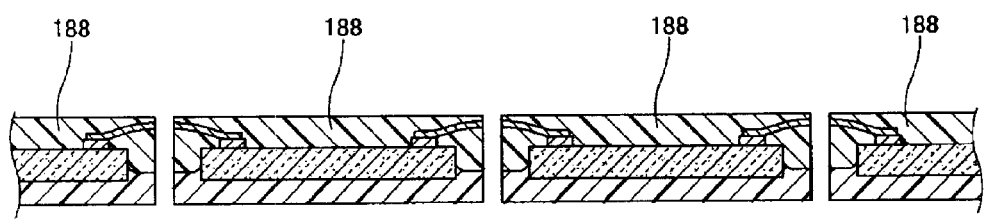
Figure 19C:
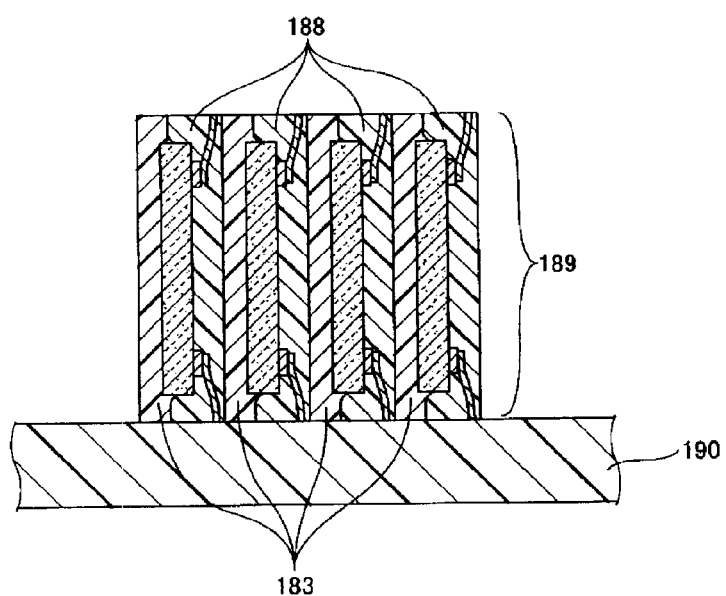

FIG. 19C(g) shows a chip sealing body 188 that is cut into individual pieces from a group of chip sealing bodies 186. The interval between the diced chip sealing bodies is set to 20 μm to 30 μm, for example. When the spur tooth is used as the blade of the dicer device, the chip sealing body whose corner portion has a rectangular section as shown in FIG. 19C(g) is formed.

(Another Method of Forming the Chamfer Surface at the Corner Portion of the Chip Sealing Body)

As another method of widening the area of the exposed portion of the bonding wire from the surface of the sealing resin of the chip sealing body, as shown in the above third embodiment, the chamfer surface can be formed on the corner portion of the chip sealing body by the bevel cutting blade fitted on the dicer device. That is, the method of forming the chamfer surface in step 2A-d) is employed. In such case, as illustrated in FIG. 12G, the exposed surface of the end portion of the conductive connecting material (bonding wire) on the chamfer surface 121 has the inclination angle θ3 to the longitudinal direction 122 of the conductive connecting material. Therefore, the wide connection surface to the conductive bonding wire can be ensured in the conductive connection, and thus the good electrical characteristics can be obtained. Also, like the third embodiment, the effective dicing of the chip sealing body can be carried out by the method such as the dual dicing using a plurality of blades, or the like.

(Step 3A; Conductive Connection)

(Step 3A-a; Stacking of the Chip Sealing Bodies)

The chip sealing bodies are stacked, and the conductive connection is provided between respective chip sealing bodies. A plurality of sealing chips are stacked and fixed mutually.

FIG. 19C(h) shows a state that the stacking of the chip stacking bodies is completed. The chip sealing bodies 188 are stacked via the die attach film 183 as the adhesive resin layer on a holder 190, and thus a chip stacked body 189 is formed.

(Step 3A-b; Conductive Connection (Wire Bonding))

The end portions of respective conductive connecting material exposed from the surface of the chip sealing bodies are connected by the conductive bonding wire respectively.

Figure 19D:
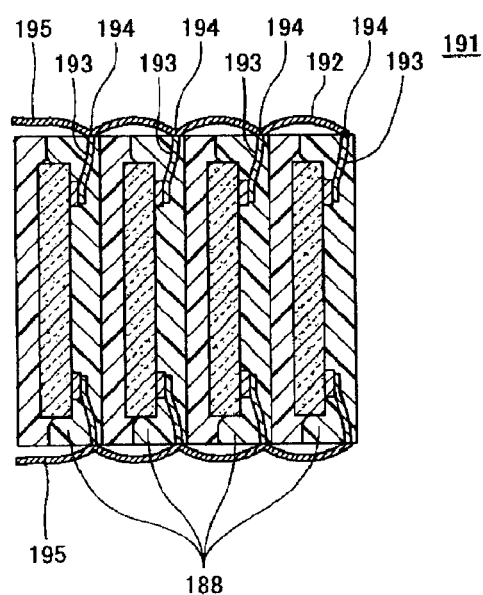
Figure 19D:
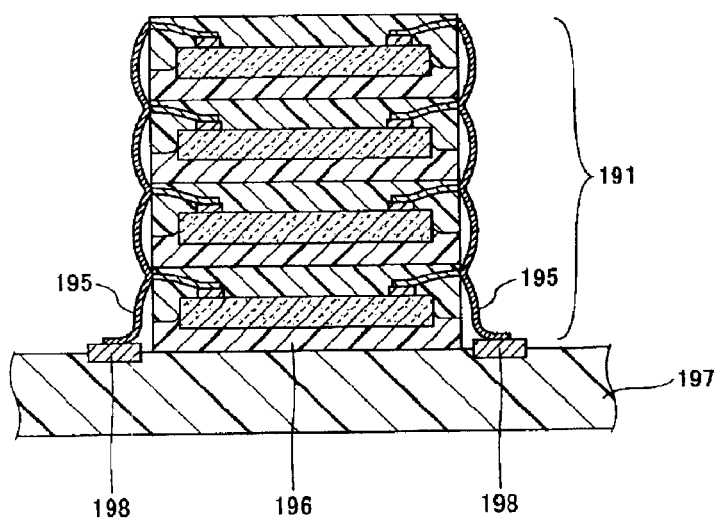

FIG. 19D(i) shows a chip stacked body 191 in a state that the conductive connection given by the wire bonding connecting method is finished. As the material of a bonding wire 192, gold, aluminum, copper, tungsten, or their alloy is employed. When the aluminum is used, normally an outer diameter is set to 100 μm or less, and the bonding operation can be applied at an ordinary temperature. End surfaces 194 of bonding wires (conductive connecting materials) 193 exposed from the surface of the stacked chip sealing bodies 188 can be bonded successively and collectively by using the wire bonding machine (not shown). The bonding wire being connected conductively may be shaped away from the side surface of the sealing resin of the chip sealing body, as illustrated, or may be shaped to contact the side surface. An end portion 195 of the bonding wire 192 is the portion that acts as the terminal for the wiring connection to the wiring substrate.

(Step 4A; Wiring Connection of the Chip Staked Body)

The wiring connection between the chip stacked body and the wiring substrate corresponds to the final step in assembling the package, and thus the package product is completed. The package product in which the semiconductor chips are stacked is installed into the electronic device via the wiring substrate.

FIG. 19D(j) shows a state that the wiring connection of the chip stacked body is completed.

(Step 4A-a; Mounting of the Chip Staked Body on the Substrate)

The chip stacked body 191 whose conductive connection is completed is mounted on a wiring substrate 197, and is adhered/secured thereto by a die attach film 196.

(Step 4A-b; Connection Between the Substrate and the Wirings)

In FIG. 19D(j), such a state is shown that the end portions 195 of the bonding wires and connection terminals 198 of the wiring substrate 197 are connected by the wiring. With the above, the manufacture of the semiconductor chip stacked body is ended.

Advantages of the Seventh Embodiment

The first advantage is improvements in a product quality and a manufacturing yield. Without the provision of the particular sorting step for KGD (Known Good Die) in the manufacturing steps, the package of the semiconductor chip stacked body consisting of KGDs only can be manufactured.

As the semiconductor packaging steps, the manufacturing steps of the wafer level package (WLP) make it possible to handle an assemble of semiconductor chips as it is as the wafer dimension, and has a mass-production effect and is extremely effective in improving a quality. This is because the package can be manufactured while handling the semiconductor chips arranged over the whole wafer as a successive integrated product. However, out of the semiconductor chips arranged on the wafer, the semiconductor chip decided as the defective one by the inspection is contained. Therefore, normally the means or the step of removing the defective chip is needed upon mounting the semiconductor chip on the packaged wiring substrate. In this event, according to the manufacturing method of the seventh embodiment, only KGDs can be picked up upon picking up the semiconductor chips in step 2A-a, and then mounted on the die attach film. Therefore, the package using KGDs only can be manufactured even when the particular sorting step is not provided to remove the defective chip. As a result, improvements in a product quality and a manufacturing yield can be achieved.

The second advantages are improvements in a product quality and a dimensional accuracy. In step 2A-a, the semiconductor chip 181 as KGD is picked up and mounted in a predetermined position on the newly prepared die attach film 183 by using the optical equipment, or the like. Since an accuracy of the mounting position, which are set based on the numerical values such as the sealing margin in the resin sealing, the blade of the dicer device used to get the diced chip sealing body, etc., can be ensured, a dimensional accuracy of the chip sealing body can be improved. Also, a thickness of the sealing resin in the side surface of the semiconductor chip can be obtained freely with high accuracy to meet the needs in the using environment. Accordingly, a product quality can be improved much more in contrast to the method that manufactures the chip sealing body by expanding/enlarging the dicing tape, or the like.

The third advantage is the simplification of the steps. Since the die attach film having a function of the resin sealing is employed, the stacking/securing of the overall chip sealing bodies can be executed even though the step of providing newly the adhesive layer for the stacking operation is not executed in stacking the chip sealing bodies. Therefore, the manufacturing steps can be simplified.

Application Example of the Seventh Embodiment

Figure 20:
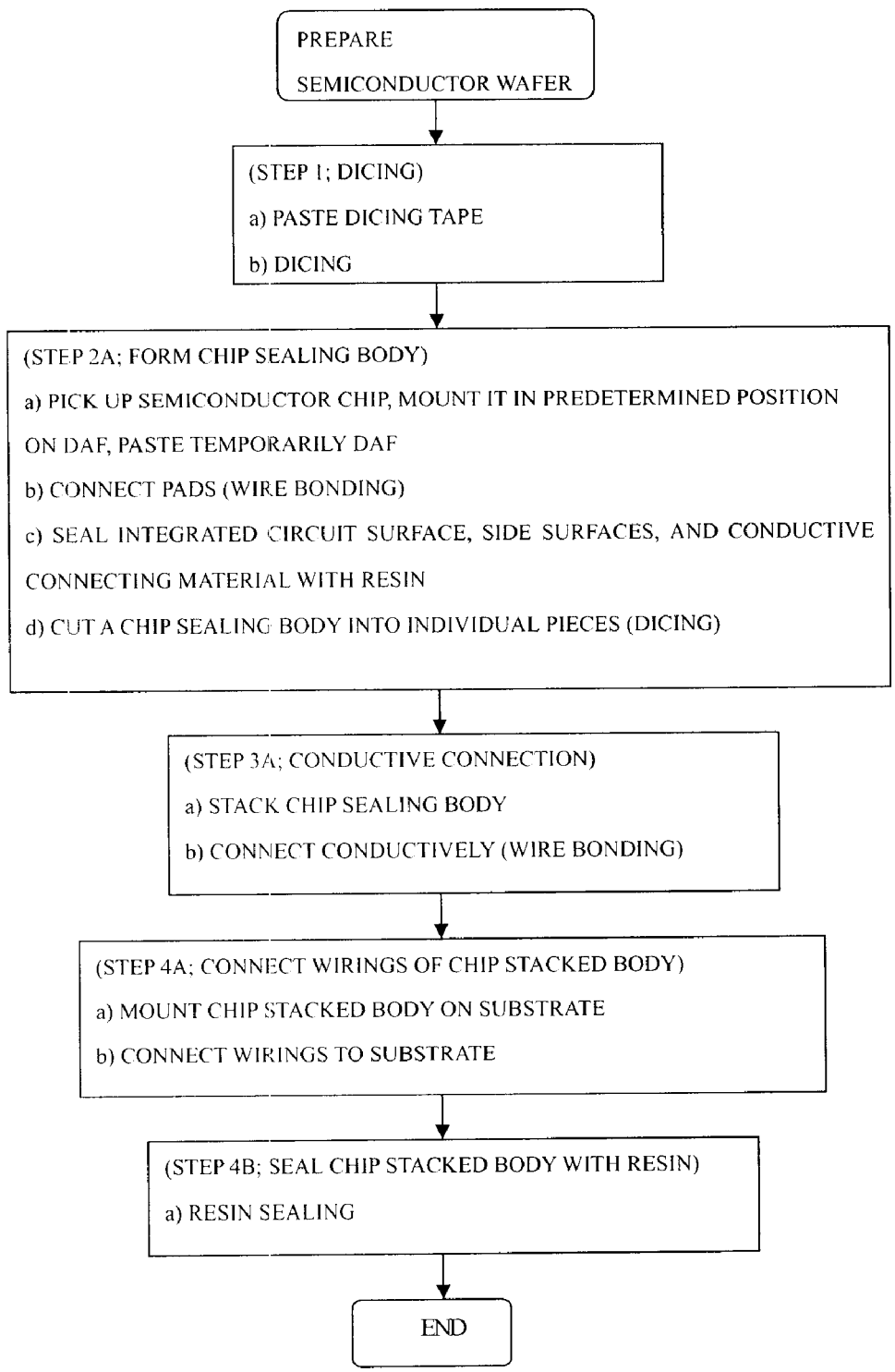
FIG. 20 is a view showing a method of manufacturing a semiconductor chip stacked body according to an application example of the seventh embodiment of the present invention.

Depending on the using conditions of the chip stacked body being connected to the wiring substrate by the wirings, the manufacturing method of applying the resin sealing to the chip stacked body, like step 4B shown in next FIG. 20, is needed.

FIG. 20 is a view showing a method of manufacturing a semiconductor chip stacked body according to an application example of the seventh embodiment of the present invention.

The present manufacturing method includes the steps of step 1; dicing, step 2A; form a chip sealing body, step 3A; conductive connection, step 4A; connect wirings of the chip stacked body, and step 4B; Resin sealing of the chip stacked body. This semiconductor chip manufacturing method is characterized by a "chip stacked body resin sealing step" of sealing the chip stacked body and the wiring substrate with a resin, in addition to the state that the wiring connection of the chip stacked body is completed in the foregoing seventh embodiment. The explanations of respective steps of the present manufacturing method being redundant from those in the above seventh embodiment will be omitted herein, and only step 4B; Resin sealing of the chip stacked body will be explained hereunder.

(Step 4B; Resin Sealing of the Chip Stacked Body)

Figure 21:
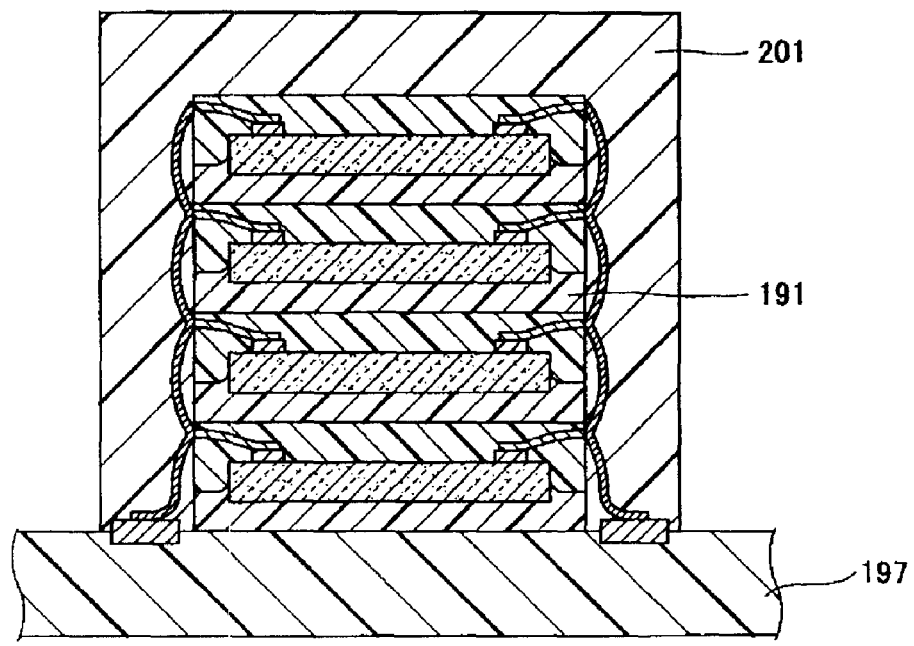
FIG. 21 is a view showing a state of the chip stacked body whose resin sealing in step 4B; resin sealing of the chip stacked body is completed.

FIG. 21 is a view showing a state of the chip stacked body whose resin sealing in step 4B; resin sealing of the chip stacked body is completed. Such a state is shown that the chip stacked bodies 191 whose wiring connection is completed and the wiring substrate 197 are sealed with a sealing resin 201. As the method of the resin sealing, the transfer molding method, the potting method, or the like may be chosen.

Advantage of the Application Example of the Seventh Embodiment

Since the overall chip stacked body is sealed with a resin, a high quality capable of withstanding the environment can be provided even when an application product of such chip stacked body is used in the mechanically and chemically severe environments.

Eighth Embodiment

The invention according to an eighth embodiment of the present invention is different from the invention of the manufacturing method according to the third to seventh embodiments concerning "the chip sealing bodies are diced into individual pieces and then stacked" in that "a group of chip sealing bodies constituting a flat plane are stacked collectively, and then diced into individual pieces". This invention is characterized in that a plurality of sets of the chip sealing bodies are formed on the framed DAF by applying the pad connection and the sealing to a plurality of semiconductor chips on DAF while using DAF (die attach film) provided to the fixed frame, then the semiconductor chips are stacked together with the frame by using the optical aligning mechanism, or the like, then the whole chip sealing bodies are cured, and then individual chip stacked bodies are obtained by the dicing.

Figure 22:
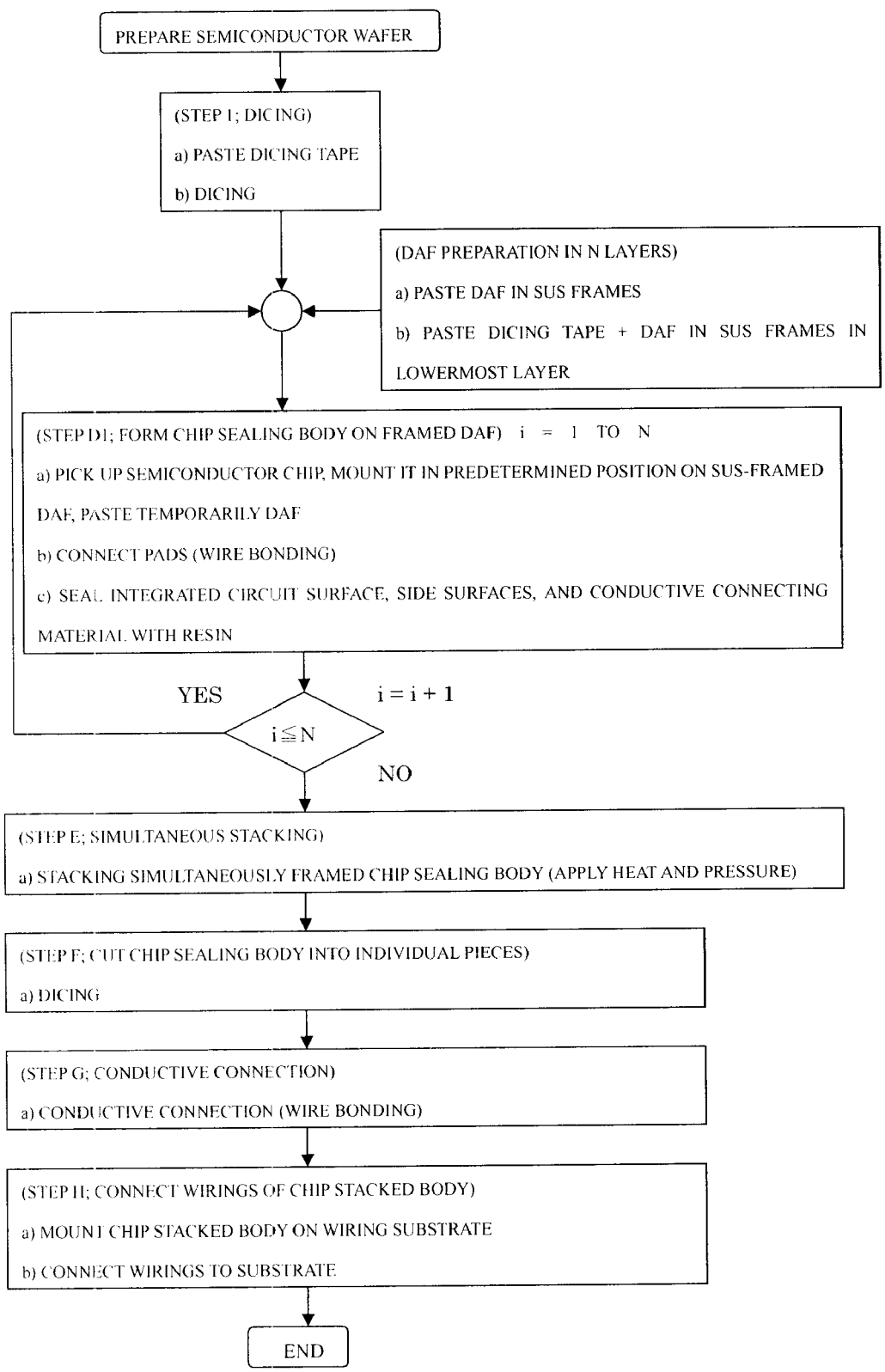
FIG. 22 is a view showing a method of manufacturing a semiconductor chip stacked body according to an eighth embodiment of the present invention.

FIG. 22 is a view showing a method of manufacturing a semiconductor chip stacked body according to an eighth embodiment of the present invention.

This manufacturing method includes step 1; dicing, DAF preparation, step D1; form the chip sealing body on the framed DAF, step E; simultaneous stacking, step F; dice the chip sealing body into individual pieces, step G; conductive connection, and step H; connect wirings of the chip stacked body, and the semiconductor chip stacked body is manufactured.

Figure 23A:
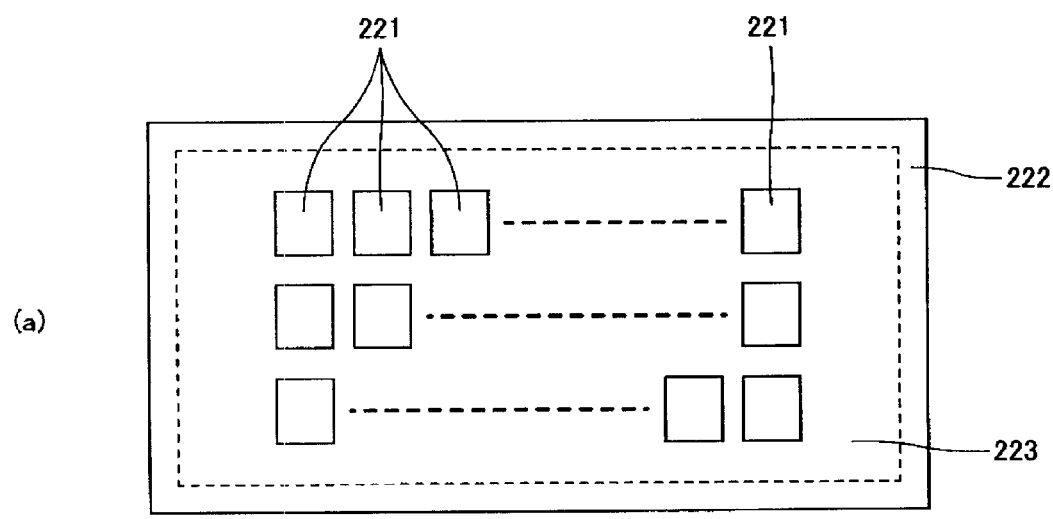
FIG. 23A to FIG. 23C are views showing respective states in order in the manufacturing method according to the eighth embodiment.
Figure 23A:
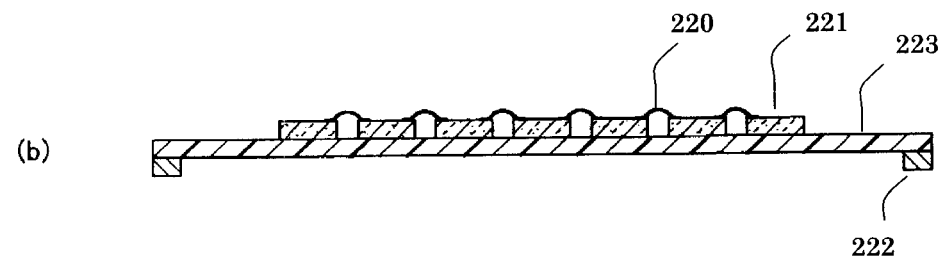
Figure 23B:
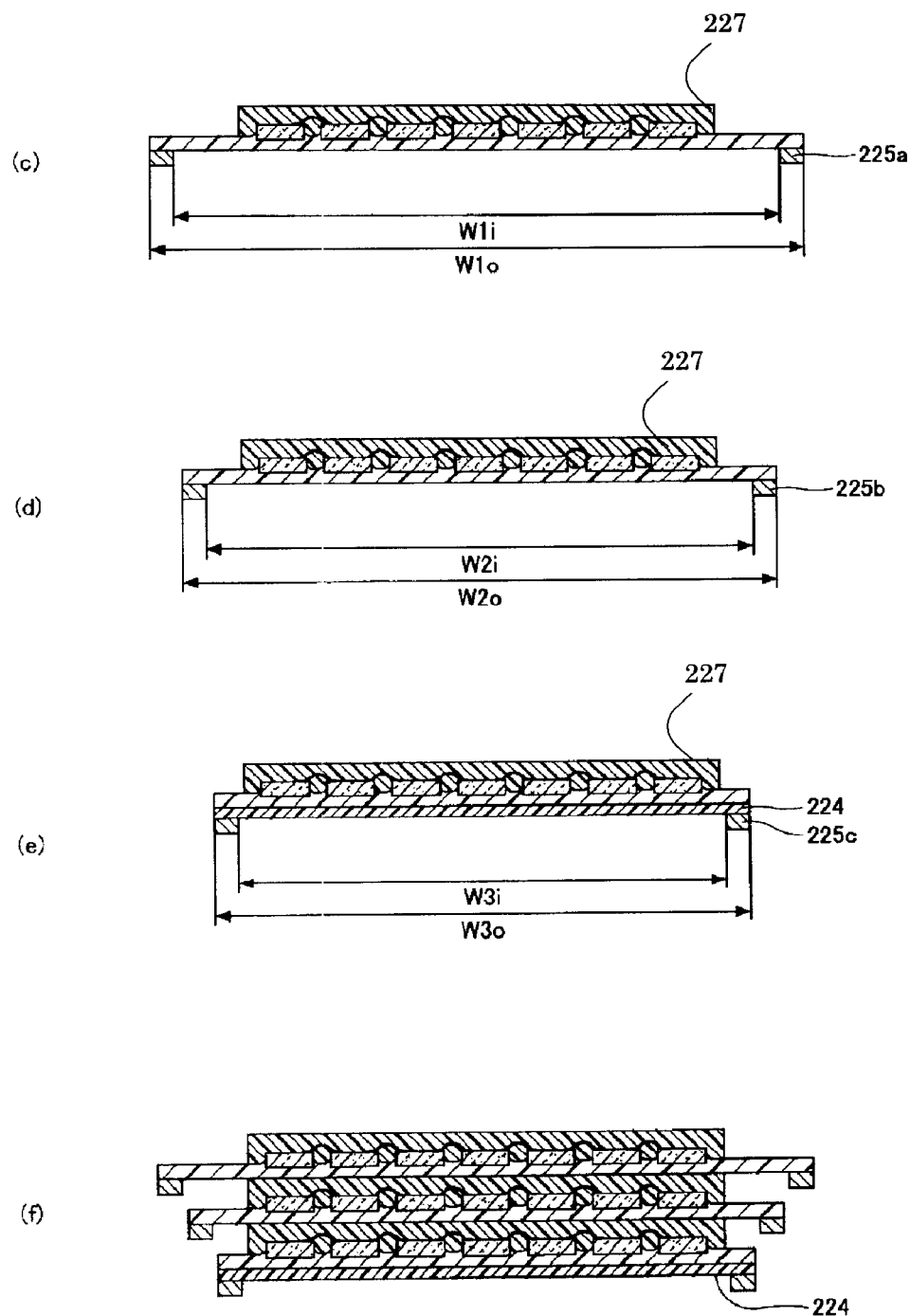
Figure 23C:
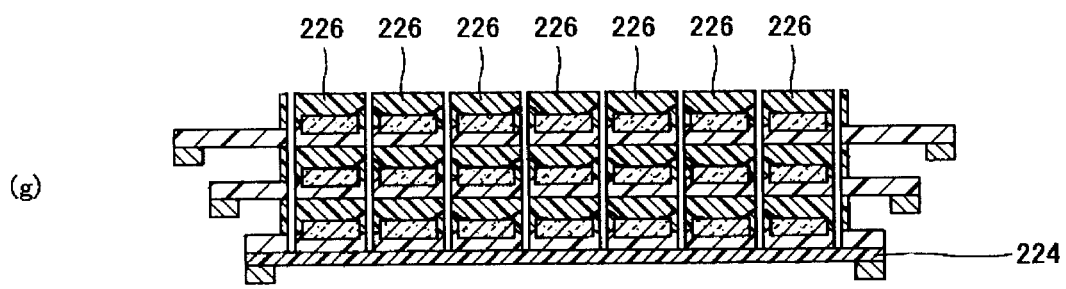

FIG. 23A to FIG. 23C are views showing respective states in order in the manufacturing method according to the eighth embodiment. The manufacturing method shown in FIG. 22 will be explained in order of step with reference to the drawings of respective states in FIG. 23A to FIG. 23C hereunder.

(Step 1; Dicing)

Since this dicing step is similar to that shown in the seventh embodiment, and the like, its explanation will be omitted herein.

(DAF Preparation)

The die attach film (DAF) that is pasted onto the SUS frame is prepared as many as the number of stacked layers of the chip sealing body corresponding to N layers. Any fixed frame may be employed as the SUS frame if such fixed frame is formed of the material that is not altered and deformed during the manufacturing steps. Only the DAF on which the SUS frame is pasted and which corresponds to the lowest layer is prepared as the DAF that is stacked on the pasted dicing tape.

The DAF in the lowest layer is needed when the stacked chip sealing bodies are diced into individual pieces. Also, a register mark used in the stacking is provided to the SUS frames or the DAF surfaces respectively.

(Step D1; Formation of the Chip Sealing Body on the Framed DAF)

(Step D1-*a*; Pick Up the Semiconductor Chip, Mount it in a Predetermined Position on SUS framed DAF, Paste Temporarily DAF)

FIG. 23A(a) shows such a state that diced semiconductor chips 221 are picked up and are mounted on a die attach film 223, onto which a SUS frame 222 is pasted, and are aligned in predetermined positions. The back surface side of the semiconductor chips located on the opposite side to the integrated circuit surface is sealed by the DAF having a function of the sealing resin. The alignment of the semiconductor chips is decided under respective conditions such as dimension of the semiconductor chip, dimension of the overall chip sealing body, dicing of the chip sealing body, and the like, for example, 3 rows×7 columns, 3 rows×10 columns, or the like.

(Step D1-*b*; Pad Connection (Wire Bonding))

The bonding wires 220 used in the conductive connection of the chip sealing body are connected to the pads on the semiconductor chips. The connecting method and the connecting mode are similar to those in the seventh embodiment, and the like.

FIG. 23A(b) shows a state after the pads are connected.

(Step D1-*c*; Resin Sealing of the Integrated Circuit Surface, Side Surfaces, and the Conductive Connecting Material)

FIG. 23B(c) shows a state that the integrated circuit surface, the side surfaces, and the conductive connecting material (bonding wire) are sealed with a resin 227. The explanation about the resin sealing of the pad connection and the integrated circuit surface overlaps with that in step 2A of the seventh embodiment, and their explanation will be omitted herein.

FIGS. 23B(d)(e) show respective states after the chip sealing bodies in the second layer and the third layer are sealed with a resin 227. In the eighth embodiment, an example in which the number of stacked layers of the chip sealing body is set to three is illustrated. Therefore, a dicing tape 224 prepared in the DAF preparation is provided onto the lowest surface of the third-layer chip sealing body as the lowest layer shown in FIG. 23B(e). As to respective dimensions of SUS frames 225*a*, 225*b*, 225*c* shown in FIGS. 23B(c) to (e), in order to prevent the mutual interference caused in the subsequent collective stacking operation, W1*i*, W2*o*, W2*i*, W3*o* out of dimensions W1*o*, W2*o*, W3*o* of outer widths of the SUS frames and dimensions W1*i*, W2*i*, W3*i* of inner widths of the SUS frames must be set to satisfy following Inequalities (A22). Also, longitudinal dimensions of the SUS frames must be set to satisfy the similar relations.

$$W1i > W2o, W2i > W3o \quad (A22)$$

Even when the number of stacked layers is increased, the stacking operation can be done smoothly by keeping the similar relations to such relations.

(Step E; Simultaneous Stacking)

In this step, the chip sealing bodies constituting respective layers are stacked collectively while they are still mounted on the die attach film on the SUS frame.

FIG. 23B(f) shows a state that such simultaneous stacking is completed. In the stacking operation, a pressure applying condition and a thermosetting condition in the simultaneous stacking are set in response to the physical properties of the sealing resin. Also, a positional accuracy in the alignment between respective layers in the stacking operation can be assured by using the optical mechanism and the position controlling system.

(Step F; Dicing of the Chip Sealing Body)

In this step, an assembly of the chip sealing bodies in which the semiconductor chips in the chip sealing bodies are mounted while they are aligned horizontally and vertically, i.e., the semiconductor chips are aligned in a matrix fashion, is diced collectively by using the dicer device. Upon the dicing to cut the chip sealing bodies into individual pieces, the optical mechanism and the position controlling system are employed to keep a dimensional accuracy.

FIG. 23C(g) shows a state that the dicing of the chip sealing bodies is completed. Respective chip sealing bodies 226 that underwent the dicing are still put on the dicing tape 224 to keep the interval.

(Step G; Conductive Connection)

Respective diced chip sealing bodies 226 on the dicing tape (224 in FIG. 23C(g)) are picked up, and the conductive connection is applied. Such conductive connection and next step H; wiring connection of the chip stacked body are similar to the contents of the steps shown in the seventh embodiment, etc., and their explanation will be omitted herein. With the above steps, the chip stacked body whose wiring connection is completed, as shown in above FIG. 19D(j), can be obtained.

Also, the resin sealing can be applied to the chip stacked body whose wiring connection is completed. As shown in FIG. 21 in the application example of the seventh embodiment, the chip stacked body whose wiring connection is completed and the wiring substrate may be sealed with a resin.

Advantages of the Eighth Embodiment

In the eighth embodiment, the dicing step is applied collectively after the chip sealing bodies are stacked. Therefore, the number of times of the dicing of the chip sealing body can be reduced widely in contrast to the seventh embodiment, and the simplification of steps and improvement of a product quality can be achieved.

Variation of the Eighth Embodiment

A variation of the eighth embodiment of the present invention shows a manufacturing method of applying the sealing/stacking collectively by using the die attach film having double-layered resin layers. According to this manufacturing method, the sealing on the bonding wire side for the pad connection, etc. and the sealing of the back surface and its neighborhood of the semiconductor chip, i.e., the surface on the opposite side to the integrated circuit surface side are carried out simultaneously with the collective stacking, by using the die attach film having the double-layered resin layers whose physical property is different respectively. Since the sealing resin that can maintain a low viscosity is required of the resin applied to seal the bonding wire portion used for the pad connection, the double-layered die attach film in which a resin layer having the physical property of a predetermined low viscosity is stacked is prepared.

Figure 24:
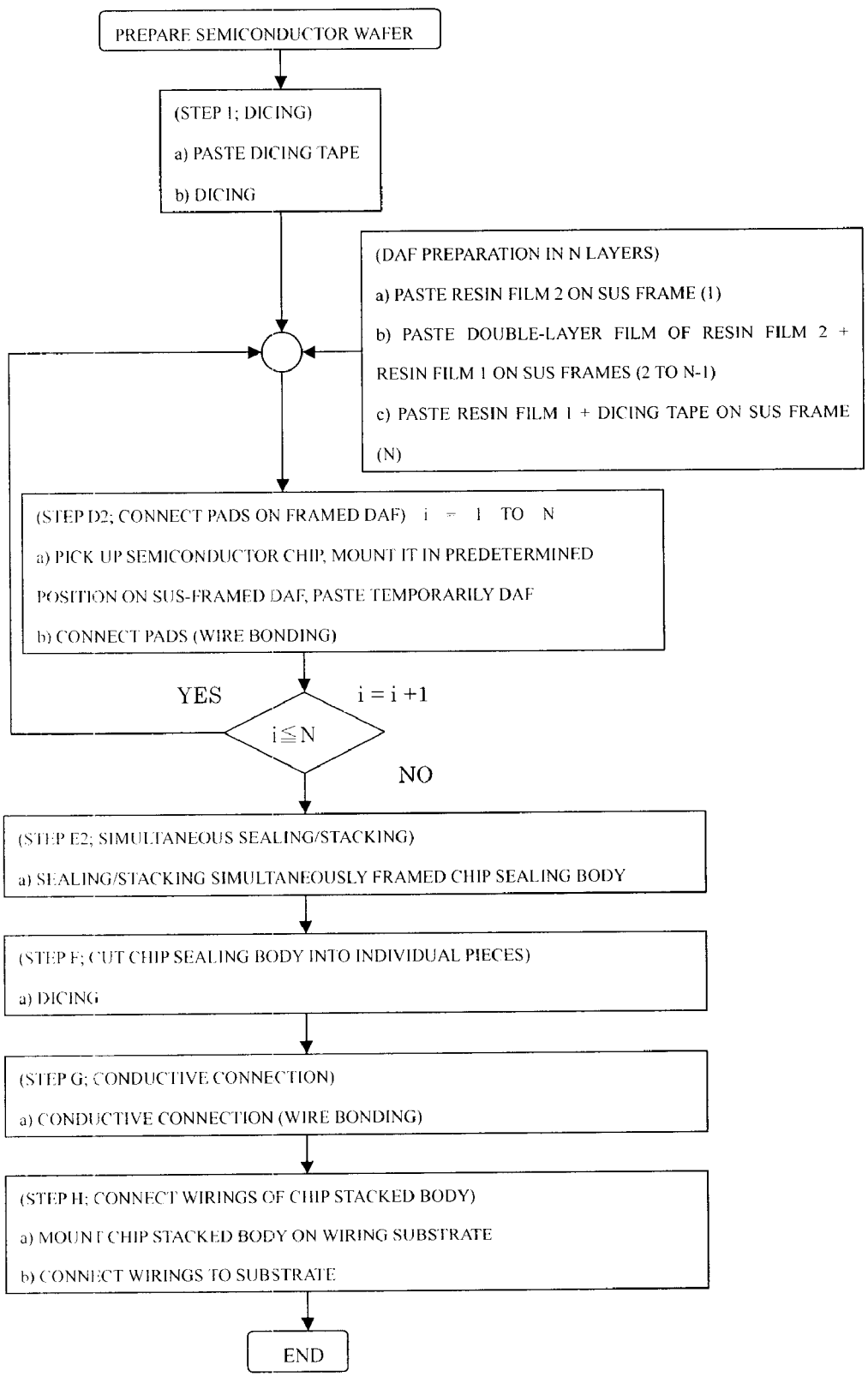
FIG. 24 is a view showing a method of manufacturing a semiconductor chip stacked body according to a variation of the eighth embodiment of the present invention.

FIG. 24 is a view showing a method of manufacturing a semiconductor chip stacked body according to a variation of the eighth embodiment of the present invention.

This manufacturing method includes respective steps of step 1; dicing, DAF preparation, step D2; formation of the chip sealing body on the framed DAF, step E2; simultaneous stacking, step F; dice the chip sealing body into individual pieces, step G; conductive connection, and step H; wiring connection of the chip stacked body, and the semiconductor chip stacked body is manufactured.

Figure 25A:
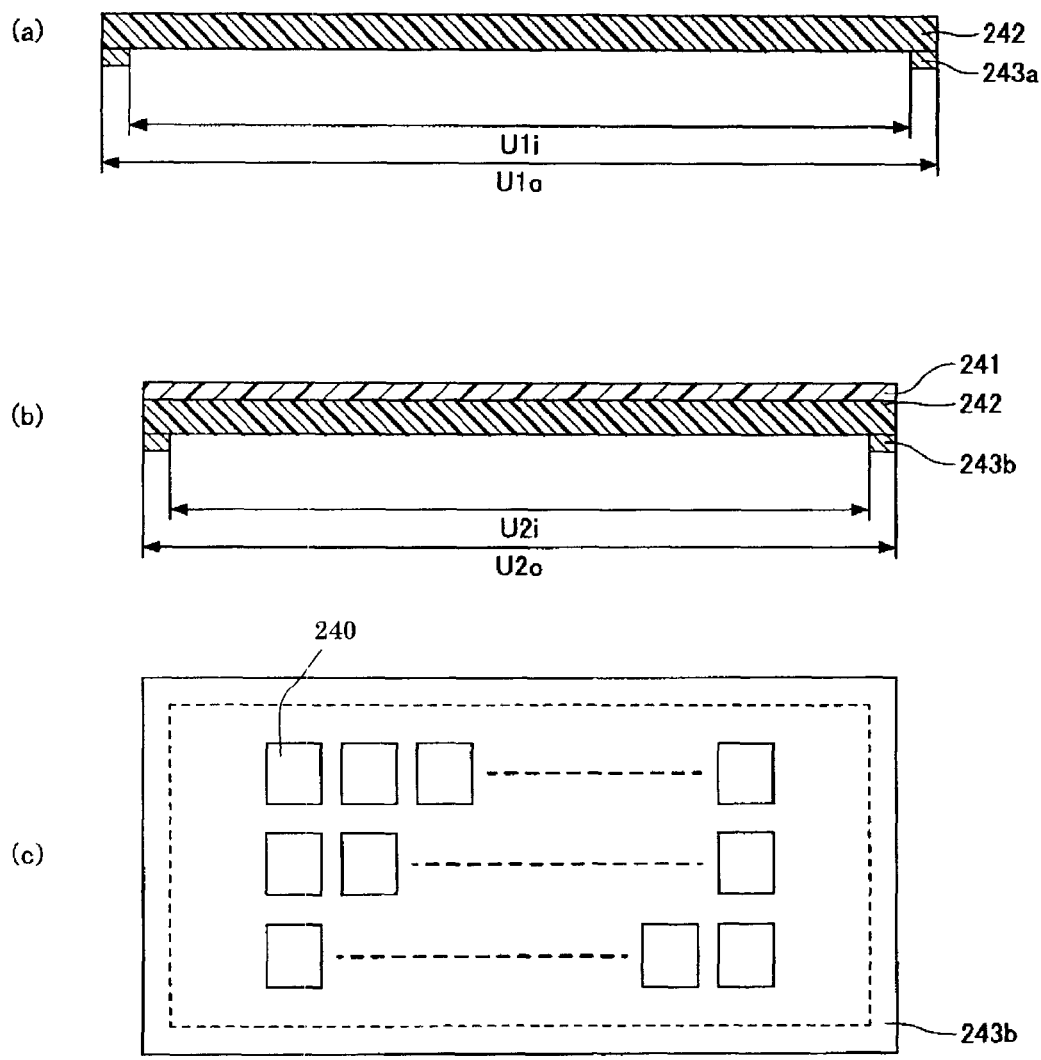
FIG. 25A and FIG. 25B are views showing respective states in order in the manufacturing method according to the variation of the eighth embodiment.
Figure 25B:
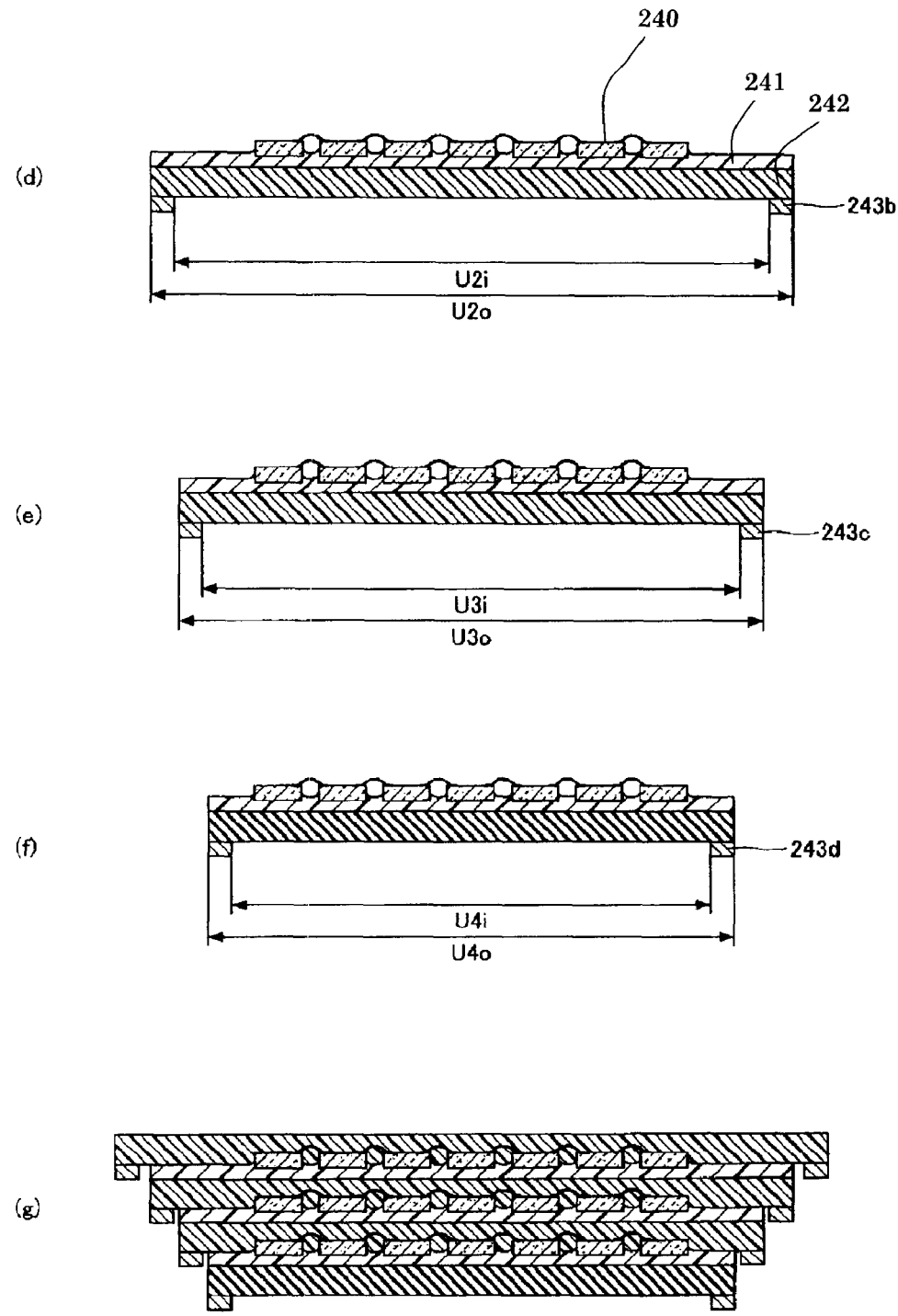

FIG. 25A and FIG. 25B are views showing respective states in order in the manufacturing method according to the variation of the eighth embodiment. The steps in a part of this manufacturing method contain the similar portions to those in the steps of the manufacturing method in the foregoing eighth embodiment, and therefore particularly different steps will be explained to avoid redundant explanations.

The variation of the eighth embodiment is different largely from the eighth embodiment, in which a single-layer die attach film is used, in that the used die attach film has the double-layered resin layers whose physical property is different respectively, and therefore the setting of the manufacturing conditions such as the temporarily pasting, the resin curing, etc. and their advantages are different.

(Step 1; Dicing)

Since this dicing is similar to that shown in the above seventh embodiment, etc., its explanation will be omitted herein.

(DAF Preparation)

The die attach films pasted on the SUS frames to correspond to the number of stacked layers are prepared.

(DAF Preparation-a)

In order to seal the portions corresponding to the chip sealing body layer, which is positioned on the uppermost layer, on the semiconductor integrated circuit side and the pad connecting bonding wire, the die attach film in which only a "resin film 2" is pasted on the SUS frame is prepared. This "resin film 2" denotes a film of the sealing resin that has the physical property of a low viscosity. The reason for employment of such film will be given as follows.

In forming the chip sealing body in Step E2; Simultaneous sealing/stacking mentioned as the later step, the resin film that can maintain the physical property of a low viscosity in pasting temporarily the film is needed such that the semiconductor chips can be sealed while keeping the upward convex shape, the English letter M, or the like not to cause the deformation of the bonding wire when the film-like sealing resin comes into contact with the bonding wire used in the pad connection. Such resin having the physical property of a low viscosity is referred to as the "resin film 2".

FIG. 25A(a) shows a state that a "resin film 2" 242 provided to the uppermost layer in the stacking of the chip stacked bodies is pasted on a SUS frame 243a.

(DAF Preparation-b)

A main body of the die attach film that seals the back surface and its neighborhood of the semiconductor chip is referred to as a "resin film 1". The film in which two type films of such "resin film 1" and the "resin film 2" are stacked is prepared as the die attach film for the chip sealing bodies in the second layer and so on.

FIG. 25A(b) shows a state that the die attach film in which a "resin film 1" 241 is stacked on the "resin film 2" 242 is pasted on a SUS frame 243b. The material of the die attach film may be selected from DF402 series manufactured by Hitachi Chemical Co., Ltd., LE5000 series manufactured by Lintec Corporation, WL-NCF series manufactured by Toray Industries, Inc., and the like, for example. Also, WL-NCF series manufactured by Toray Industries, Inc., etc. can maintain the physical property of a low viscosity at a time of pasting temporarily, and can be employed as the "resin film 2".

(DAF Preparation-c)

The dicing tape is prepared to dice the chip stacked body, and also the SUS-framed die attach film in which the "resin film 1" is pasted on the dicing tape is prepared.

(Step D2; Pad Connection on the Framed DAF)

The pad connection using the bonding wire is similar to that in the eighth embodiment.

FIG. 25A(c) shows a state that the semiconductor chips 240 that underwent Step 1; Dicing are picked up, and are mounted in a predetermined position on the die attach film that is pasted on the SUS frame in Step D2-a, respectively.

FIG. 25B(d) shows a state of the semiconductor chips whose pad connection is completed on the die attach film being pasted on the SUS frame 243b. The layer shown in FIG. 25B(d) constitutes the chip sealing body in the uppermost layer.

FIG. 25B(e) shows a state that the pad connection is completed in the layer as the second layer just under the uppermost layer. A dimension of a SUS frame 243c is set smaller than the SUS frame 243b for the chip sealing body in the uppermost layer to prevent the mutual interference.

FIG. 25B(f) shows a state that the pad connection is completed in the layer as the lowermost layer. In this example, the third layer corresponds to the lowermost layer. A dimension of a SUS frame 243d is set smaller than the SUS frame 243c for the chip sealing body in the second layer to prevent the mutual interference.

As to the dimensional relations of the SUS frames in the above, $U1i$, $U2o$, $U2i$, $U3o$, $U3i$, $U4o$ out of dimensions of outer widths $U1o$, $U2o$, $U3o$, $U4o$ and dimensions of inner widths of inner widths $U1i$, $U2i$, $U3i$, $U4i$ of the SUS frames 243a, 243b, 243c, 243d must be set to satisfy following Inequalities (A24). Also, longitudinal dimensions of the SUS frames must be set to satisfy the similar relations.

$$U1i > U2o, U2i > U3o, U3i > U4o \tag{A24}$$

(Step E2; Simultaneous Sealing/Stacking)

In this step, the resin sealing and stacking of a large number of semiconductor chips are executed simultaneously by using the SUS frame.

FIG. 25B(g) shows a state that Step E2; Simultaneous sealing/stacking is completed. The resin film, the semiconductor chips, the bonding wirings supported by the SUS frames shown in respective states (a), (d), (e), and (f) in FIG. 25A and FIG. 25B are sealed/stacked simultaneously at a time.

Next three steps, i.e., step F; Cut the chip sealing body into individual pieces, step G; Conductive connection, and step H; Connect wirings of the chip stacked body, are similar to those in the eighth embodiment, and therefore their explanation will be omitted herein to avoid the redundant recitation. With the above, the method of manufacturing the chip stacked body applied to execute "Simultaneous sealing/stacking using the die attach film having a double-layered structure" as the variation of the eighth embodiment is completed.

Also, the resin sealing can be applied to the chip stacked body whose wiring connection is ended. As shown in FIG. 21 in the application example of the seventh embodiment, the chip stacked body whose wiring connection is ended and the wiring substrate may be sealed with a resin.

Advantages of the Variation of the Eighth Embodiment

Since the die attach film having a double-layered structure is employed, the sealing and the stacking can be carried out simultaneously at a time in the overall simultaneous sealing/stacking step not to provide individual sealing steps that are applied to seal the surfaces except the back surfaces and their neighborhood of the semiconductor chips, i.e., the bonding wire portions for connecting the pads, the semiconductor

Ninth Embodiment

Figure 26A:
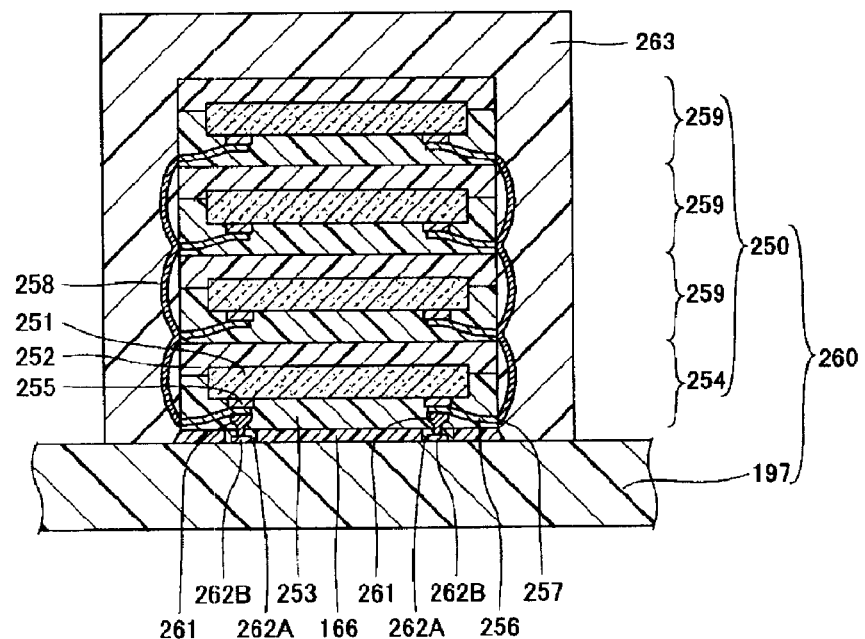
FIGS. 26A and 26B are views showing a semiconductor chip stacked body 260, which is characterized by flip-chip mounting a semiconductor chip 251 in a lowermost layer of a chip stacked body 250 on the wiring substrate 197, according to a ninth embodiment of the present invention.
Figure 26B:
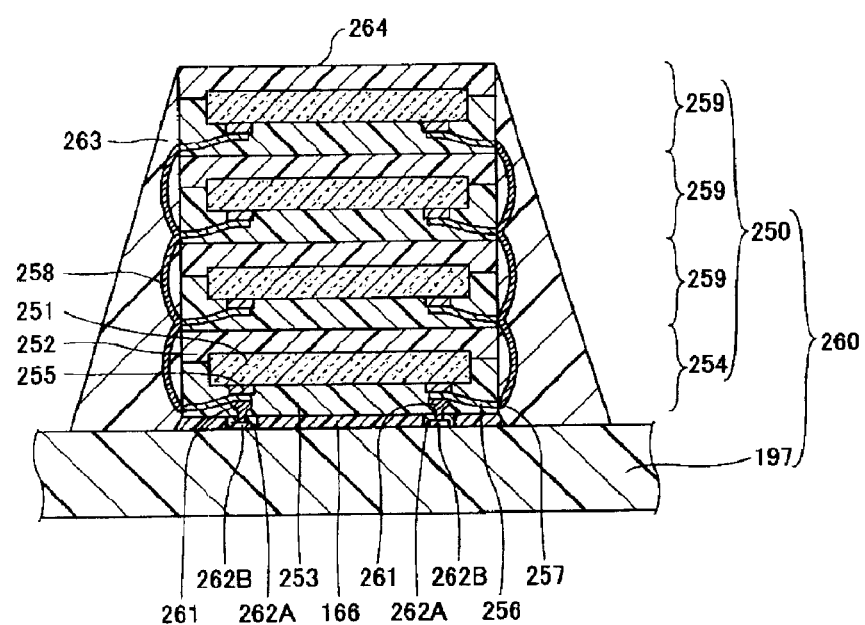

FIGS. 26A and 26B are views showing a semiconductor chip stacked body 260, which is characterized by flip-chip mounting a semiconductor chip 251 in a lowermost layer of a chip stacked body 250 on the wiring substrate 197, according to a ninth embodiment of the present invention. Only a shape of a resin sealing material 263 is different between FIGS. 26A and 26B.

Here, the flip-chip mounting denotes the technology to oppose the active element surface of the semiconductor chip to the connection terminal surface of the wiring substrate and then connect directly respective terminals of the semiconductor chip and the wiring substrate by the bumps, or the like. In some cases the sealing may be applied to the connection locations by an underfill, or the like.

The semiconductor chip 251 in the lowermost layer shown in FIG. 26A is sealed with insulating resins 252, 253 and constitute a chip sealing body 254 in the lowermost layer. An end surface 257 of a bonding wire 256 connected to a pad 255 on the semiconductor chip 251 is exposed from the side surface of the chip sealing body. The chip sealing body 254 in the lowermost layer is connected conductively to other three chip sealing bodies 259 by connecting another bonding wire 258 to the end surface 257. Bumps 261 are formed to contact the bonding wire 256 on the pads 255. The bumps 261 pass through the insulating resin 253 and are connected to solder terminals 262A provided to the wiring substrate 197. The solder terminals 262A are connected to connection terminals 262B on the wiring substrate 197 respectively. In some cases, the sealing may be applied to a clearance portion, through which the chip sealing body 254 in the lowermost layer opposes to the wiring substrate 197, by the underfill 166.

Here, as the bumps 261, for example, bumps shown in FIG. 28C of a tenth embodiment described later, or the like may be employed.

In FIG. 26A, the chip stacked body 250 is sealed with the resin sealing material 263. That is, the chip sealing body 254 in the lowermost layer, other three chip sealing bodies 259, another bonding wire 258, the bumps 261, the solder terminals 262A, and the wiring substrate 197 are sealed.

In FIG. 26B, the whole chip stacked body 250 is sealed with the resin sealing material 263 such that a surface 264 of the insulating resin of the chip sealing body in the uppermost layer is exposed to improve a heat radiation from the semiconductor chip, and the like.

Advantages of the Ninth Embodiment

The chip stacked body whose size is reduced substantially to a chip size can be flip-chip mounted on the wiring substrate. Therefore, improvements of the performance and the quality of the semiconductor chip stacked body can be achieved.

Tenth Embodiment

Figure 27:
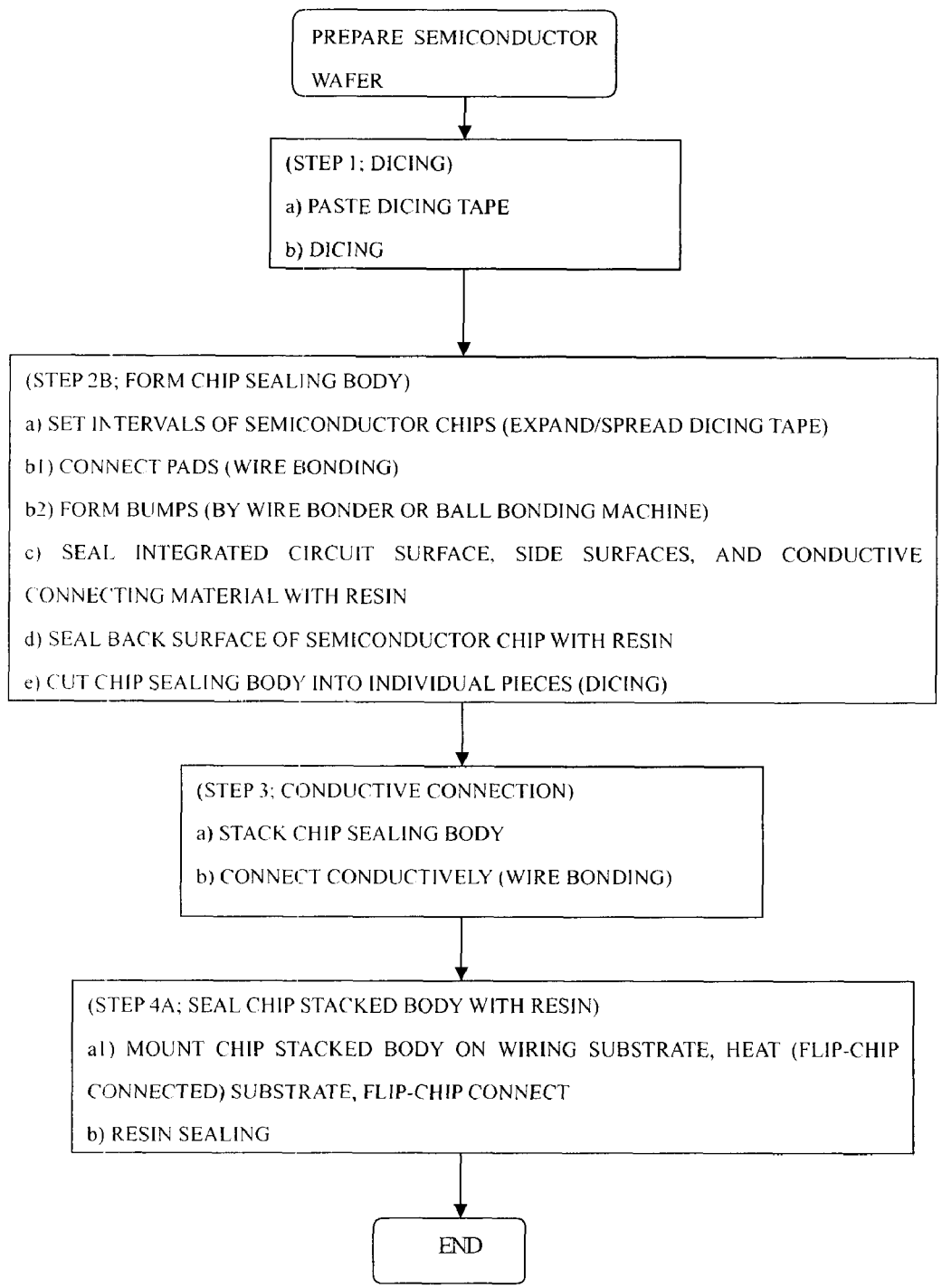
FIG. 27 is a view showing steps of a method of manufacturing a semiconductor chip stacked body according to a tenth embodiment of the present invention.

FIG. 27 is a view showing steps of a method of manufacturing a semiconductor chip stacked body according to a tenth embodiment of the present invention. This manufacturing method is characterized in that the chip sealing body in the lowermost layer in the chip stacked body is flip-chip connected to the wiring substrate. In comparison with the steps (FIG. 11) in the manufacturing method according to the foregoing third embodiment, a step of forming the bumps in step 2B-b2 of Step 2B; form the chip sealing body, and respective steps of mounting the chip stacked body on the wiring substrate, heating the substrate, and flip-chip connecting the substrate in step 4A-a1 of Step 4A; seal the chip stacked body with a resin are different. Therefore, two different steps will be mainly explained with reference to FIG. 28A to FIG. 29 hereunder, and the explanation about other steps in Step 2B; form the chip sealing body and respective steps in Step 3; conductive connection will be omitted herein to avoid the redundant recitation.

(Step 2B; Formation of the Chip Sealing Body, b2; Formation of the Bumps)

Figure 28A:
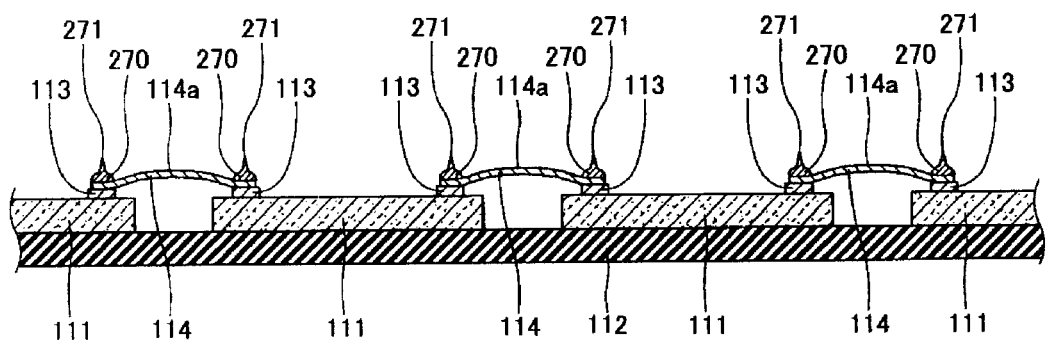
FIGS. 28A to 28C are views showing the method of manufacturing the semiconductor chip stacked body according to the tenth embodiment of the present invention.
Figure 28B:
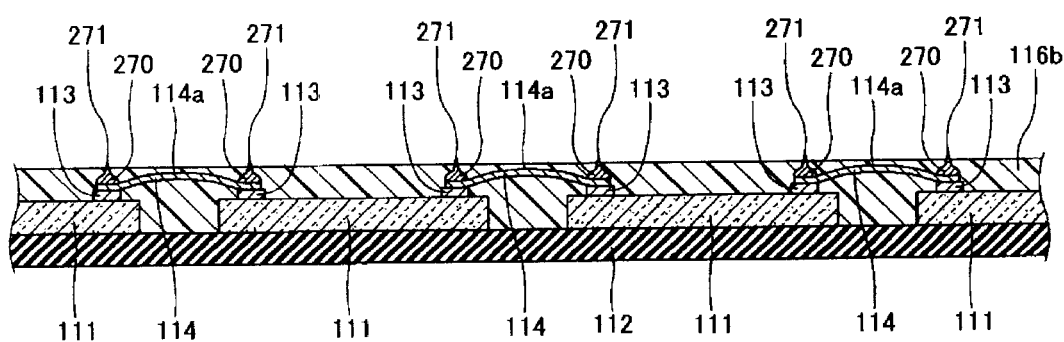
Figure 28C:
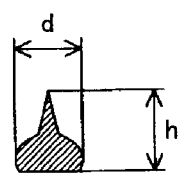

FIGS. 28A to 28C are views showing the method of manufacturing the semiconductor chip stacked body according to the tenth embodiment of the present invention. FIG. 28A shows a general view, FIG. 28B shows a state that a sealing is applied by the insulating resin, and FIG. 28C shows a shape of one bump. In this case, the reference symbols similar to those affixed to the corresponding portions in above FIG. 12C are used.

In FIG. 28A, bumps 270 are formed in positions, which correspond to the pads 113, on the bonding wires 114 that are connected to the pads. A shape of the bump 270 having a sharp head portion 271 is formed by using the wire bonder as follows, for example.

A top end of another bonding wire (not shown) for the bump, which is passed through a capillary of the wire bonder, is heated to form a ball. The ball at the top end of the bonding wire is pressure-bonded by pressure, heat, ultrasonic vibration, or the like applied from the top end portion of the capillary, and is secured onto the bonding wire 114 that is connected to the pad. Then, the bonding wire is torn off by the clamp, or the like Thus, the bump 270 having the sharp head portion 271 is formed.

In FIG. 28B, such a state is shown that a resultant structure is sealed with the insulating resin 116b after the bumps 270 are formed (step 2B-c; seal the integrated circuit surface, the side surfaces, and the conductive connecting material with the resin). The sharp head portion 271 of the bump 270 can pass through the layer of the insulating resin 116b, and a metal surface of the bump can be exposed from the surface of the resin layer. Therefore, the flip-chip connection to the wiring substrate can be done easily and smoothly.

As the material of the bump 270, for example, gold, copper, or the like may be used, but aluminum can be used depending on the connecting conditions. Also, as dimensions of the bump 270, in FIG. 28C, a diameter d is set to 17 μm to 60 μm and a height h is set to 15 μm to 60 μm, for example. The height h must be set higher than a vertex 114a of the bonding wire 114 used in the flip-chip connection. Here, the bump can be formed by loading/fixing a single ball bump on the bonding wire 114, while using the ball bump mounting machine, or the like other than the wire bonder. When a single ball bump is employed, the sharp head portion produced when the wire bonder is employed is not formed. However, the insulating resin on the surface is softened by a heat and a pressure applied when the chip stacked body is flip-chip mounted onto the wiring substrate, and the bumps are exposed. Accordingly, if the penetration of the bump through the insulating layer at a time of sealing is insufficient, such insufficient penetration can be solved, and thus the electric connection to the wiring substrate can be kept satisfactorily.

(Step 4A; Resin Sealing of the Chip Stacked Body, Step 4A-a1; Mounting of the Chip Stacked Body on the Wiring Substrate (Flip-Chip Connection))

Figure 29:
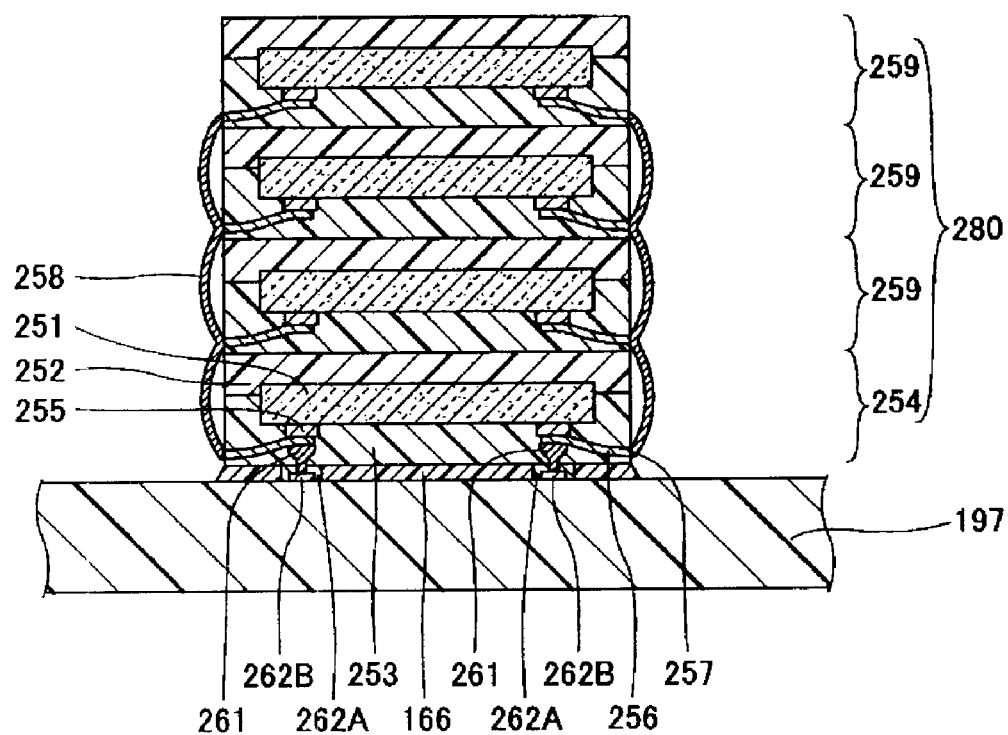
FIG. 29 is a view showing a state that a semiconductor chip stacked body 280 is mounted on the wiring substrate by the flip-chip mounting.

FIG. 29 is a view showing a state that a semiconductor chip stacked body 280 is mounted on the wiring substrate by the flip-chip mounting.

The solder terminal 262A used for the flip-chip mounting is formed to cover the connection terminals 262B on the wiring substrate 197 respectively. As the material of the solder, for example, an alloy of tin, silver, copper, or the like may be employed.

The chip stacked body 280 is aligned with the wiring substrate 197, and then the solder terminals 262A are fused by heating the wiring substrate 197. A heating temperature applied to fuse the solder is set to 230° C., for example.

Even when the exposure of the bumps 261 provided to the chip stacked body 280 is made insufficiently depending upon the surface condition of the insulating resin 253, the insulating resin 253 that covers the bumps 261 of the chip stacked body 280 is softened at a time of heating the solder terminals 262A. Therefore, the bumps 261 can penetrate the softened insulating resin 253 when the chip stacked body 280 is pressed. As a result, the bumps 261 can be exposed from the surface of the insulating resin 253, and thus the chip stacked body 280 and the wiring substrate 197 can be connected by connecting the bumps 261 to the solder terminals 262A respectively.

Also, when a single ball bump is employed as a mode of the bump, the ball bumps can be exposed similarly from the surface of the insulating resin depending on the softening of the insulating resin even though the exposure of the bumps from the surface of the insulating resin is insufficient. Therefore, the chip stacked body can be flip-chip connected to the wiring substrate.

Then, the bumps at the connection locations in the flip-chip connection, the insulating resin of the chip sealing body, and the wiring substrate are sealed with the underfill 166 in response to the using environments and conditions of the chip stacked body. Then, the chip stacked body 280 and the wiring substrate 197 are sealed wholly with the resin, and thus the foregoing semiconductor chip stacked body 260 shown in FIG. 26A can be obtained.

Advantages of the Tenth Embodiment

The manufacturing method of flip-chip mounting the chip stacked body onto the wiring substrate is provided. As a result, the mounting of the chip stacked body, a size of which is reduced substantially to a chip size, onto the wiring substrate can be implemented in a short time, and improvement in a productivity and improvement in a quality of the semiconductor chip stacked body can be achieved.

Eleventh Embodiment

Figure 30:
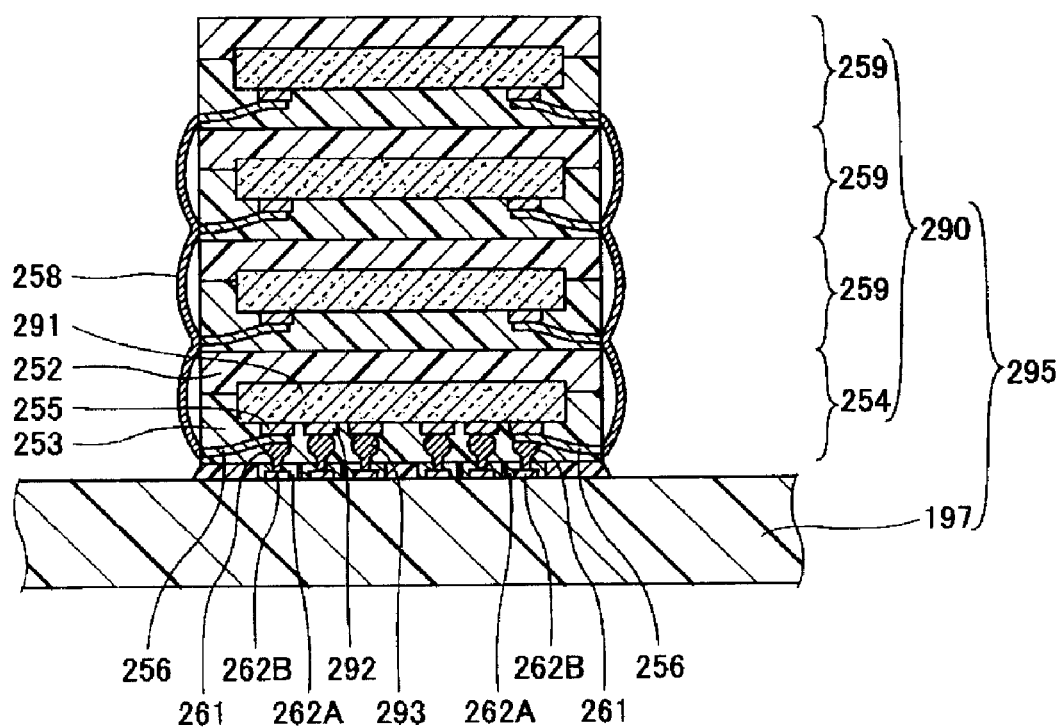
FIG. 30 is a view showing a state that another chip stacked body 290 is mounted onto the wiring substrate 197 by the flip-chip mounting.

FIG. 30 is a view showing a state that another chip stacked body 290 is mounted onto the wiring substrate 197 by the flip-chip mounting. A semiconductor chip 291 in the lowermost layer is flip-chip connected to the wiring substrate 197 via bumps 293, which are provided on pads 292 on the surface of the active element side, and the bumps 261 on the bonding wire 256.

Here, the bumps 293 can be formed on the pads 292 by the method using the wire bonder explained in the formation of the bumps in step 2B-b2 in Step 2B; form a chip sealing body, in FIG. 27 of the tenth embodiment, for example. Also, a single ball bump may be formed by using the ball bump mounting machine, or the like.

In this case, the overall shape of a semiconductor chip stacked body 295 may be set in the mode shown in FIG. 17.

Advantages of the Eleventh Embodiment

The types of the semiconductor chips that can utilize the mode of the semiconductor chip stacked body of the present invention can be expanded, and this embodiment can contribute the expansion of function as the composite semiconductor device. For example, the stacking of the CPU and memory semiconductor chips of the multiple terminal logic circuit, and the like can be implemented.

Other Embodiments According to the Present Invention

As above, the preferred embodiments of the present invention are explained in detail, but the present invention is not limited to the above embodiments. Various variation and substitutions can be applied to the above embodiments without departing from a scope of the present invention.

For example, the technology of the flip-chip mounting shown in the ninth, tenth, or eleventh embodiment can be applied to the chip stacked body shown in the above first to eighth embodiments, and the like. That is, the technology of the semiconductor chip stacked body that is characterized by the bumps, which are formed after the pad connection of the semiconductor chip is applied, and the flip-chip mounting of the semiconductor chip in the lowermost layer of the chip stacked body onto the wiring substrate can be applied. A projected area of the chip stacked body in the direction perpendicular to the stacking can be shaped substantially into a chip size, and therefore a size reduction and a higher performance of the semiconductor chip stacked body can be achieved.

What is claimed is:

1. A semiconductor chip stacked body, comprising:
a plurality of chip sealing bodies, each of the chip sealing bodies including a semiconductor chip, which has a semiconductor integrated circuit, a pad and a conductive connecting material connecting the pad to an external device, and a resin sealing the semiconductor chip, each of the chip sealing bodies being shaped into a cubic form in which a portion of the conductive connecting material except an end portion located on an external device side and all surfaces of semiconductor chip is sealed by the resin and the end portion of the conductive connecting material located on the external device side is exposed from the cubic form;
a wiring substrate which has a connection terminal;
a conductive bonding wire used for side surface wiring which connects between chips, the conductive bonding wire connecting the end portions of the conductive connecting materials in the plurality of chip sealing bodies and the connection terminal respectively, the conductive bonding wire being a metal wire supplied from a wiring bonder; and
a resin sealing material which seals the plurality of chip sealing bodies, the conductive bonding wire, and the wiring substrate,
wherein the plurality of chip sealing bodies are stacked on the wiring substrate, and exposed end portions of the conductive connecting materials in the chip sealing bodies are conductively connected by the conductive bonding wire respectively.

2. A semiconductor chip stacked body according to claim 1, wherein each of the chip sealing bodies has a chamfer surface as a flat surface or a concavely curved surface at a corner portion, and the end portion of the conductive connecting material on the external device side of the each of the chip sealing bodies is exposed from the chamfer surface.

3. A semiconductor chip stacked body according to claim 2, wherein at least one pair of chip sealing bodies are stacked to oppose respective chamfer surfaces to each other in such a manner that spatial shapes made by the chamfer surfaces of the chip sealing bodies respectively possess planar symmetry with respect to respective stacked surfaces of the pair of chip sealing bodies as a symmetric place.

4. A method of manufacturing a semiconductor chip stacked body having a plurality of chip sealing bodies which are stacked and conductively connected mutually, and a wiring substrate which mounts the plurality of chip sealing bodies thereon, each of the chip sealing body including a semiconductor chip having a semiconductor integrated circuit, a pad and a conductive connecting material, and a resin sealing the semiconductor chip, the method comprising:
  a step of dicing a semiconductor wafer, which has semiconductor integrated circuits and pads, by using a dicing tape, into individual pieces to form the plurality of semiconductor chips;
  a step of forming a plurality of chip sealing bodies by connecting the pads of the semiconductor chips obtained by the dicing step to each other by the conductive connecting material respectively on the dicing tape, sealing the semiconductor chips with the resin, peeling the dicing tape, sealing portions of the semiconductor chips exposed by the peeling with the resin, and then dicing a resultant structure into individual pieces;
  a step of forming a chip stacked body by stacking the plurality of chip sealing bodies, and then connecting conductively end portions of the conductive connecting materials, which are exposed from surfaces of the plurality of chip sealing bodies, by a conductive bonding wire mutually; and
  a step of mounting the chip stacked body on the wiring substrate, and then connecting the chip stacked body and the wiring substrate via a wiring.

5. A method of manufacturing a semiconductor chip stacked body, according to claim 4, further comprising: a step of sealing the chip stacked body and the wiring substrate with a resin sealing material.

6. A method of manufacturing a semiconductor chip stacked body, according to claim 4, wherein the step of forming the chip sealing body has a step of expanding or spreading the dicing tape, and
  wherein the semiconductor chips are sealed with the resin after the expanding or spreading step, and after the dicing tape is peeled, the portions of semiconductor chips exposed by the peeing is sealed with the resin.

7. A method of manufacturing a semiconductor chip stacked body, according to claim 4, further comprising:
  a step of chamfering a corner portion of each of the chip sealing bodies to form a chamfer surface to expose an end portion of the conductive connecting material in the chamfer surface.

8. A method of manufacturing a semiconductor chip stacked body, according to claim 4, wherein the pad connection by the conductive connecting material is made by a method of a wire bonding.

9. A method of manufacturing a semiconductor chip stacked body, according to claim 8, wherein the method of the wire bonding employed in the pad connection is applied such that a shape of the bonding wire in a plane that contains the bonding wire between connection points in the bonding constitutes a curve that has at least one concave portion.

10. A method of manufacturing a semiconductor chip stacked body, according to claim 4, wherein, in the step of forming the chip sealing body, a dicing tape is used for dicing the resultant structure into individual pieces, and a die attach film is employed as the dicing tape.

11. A method of manufacturing a semiconductor chip stacked body, according to claim 4, wherein, in the step of forming the chip sealing body, a dicing tape is used for dicing the resultant structure into individual pieces, and the dicing tape has an adhesive layer on a surface on an opposite side to an adhesive surface to the chip sealing body.

12. A method of manufacturing a semiconductor chip stacked body having a plurality of chip sealing bodies which are stacked and conductively connected mutually, and a wiring substrate which mounts the plurality of chip sealing bodies thereon, each of the chip sealing body including a semiconductor chip having a semiconductor integrated circuit, a pad and a conductive connecting material, a die attach film with a resin sealing function, and a sealing resin, the die attach film and the sealing resin sealing the semiconductor chip, the method comprising:
  a step of dicing a semiconductor wafer, which has semiconductor integrated circuits and pads, by using a dicing tape, into individual pieces to form the plurality of semiconductor chips;
  a step of forming a plurality of chip sealing bodies by mounting the semiconductor chips obtained by the dicing step in predetermined positions on the die attach film, connecting the pads to each other by the conductive connecting material respectively, sealing the semiconductor chips and the conductive connecting materials located higher the die attach film with the sealing resin, and then dicing a resultant structure into individual pieces;
  a step of forming a chip stacked body by stacking the plurality of chip sealing bodies, and then connecting conductively end portions of conductive connecting materials, which are exposed from surfaces of the plurality of chip sealing bodies, by a conductive bonding wire mutually; and
  a step of mounting the chip stacked body on the wiring substrate, and then connecting the chip stacked body and the wiring substrate via a wiring.

13. A method of manufacturing a semiconductor chip stacked body, according to claim 12, further comprising:
  a step of sealing the chip stacked body and the wiring substrate with a resin sealing material.

14. A method of manufacturing a semiconductor chip stacked body, according to claim 12, further comprising:
  a step of chamfering a corner portion of each of the chip sealing bodies to form a chamfer surface to expose an end portion of the conductive connecting material in the chamfer surface.

15. A method of manufacturing a semiconductor chip stacked body, according to claim 12, wherein the pad connection by the conductive connecting material is made by a method of the wire bonding.

16. A method of manufacturing a semiconductor chip stacked body, according to claim 15, wherein the method of the wire bonding employed in the pad connection is applied such that a shape of the bonding wire in a plane that contains the bonding wire between connection points in the bonding constitutes a curve that has at least one concave portion.

17. A semiconductor chip stacked body, according to claim 1, wherein the semiconductor chip in a lowermost layer of the chip stacked body is flip-chip mounted onto the wiring substrate.

18. A semiconductor chip stacked body, according to claim 1, wherein
each of the plurality of chip sealing bodies forms a modular chip sealing body,
the resin sealing the semiconductor chip includes a first resin directly contacting and covering at least a first surface of the semiconductor chip and a second resin directly contacting and covering at least a second surface of the semiconductor chip, the second surface of the semiconductor chip being opposite to the first surface of the semiconductor chip, and the second resin is formed of a die attach film and is different from the first resin, and
each of the chip sealing bodies is shaped into the cubic form in which the resin directly contacts and covers all surfaces of the semiconductor chip except for the end portion of the conductive connecting material located on the external device side, which is exposed from the cubic form.

19. A semiconductor chip stacked body, according to claim 18, wherein the plurality of chip sealing bodies are stacked on the wiring substrate with an adhesive layer provided between adjacent chip sealing bodies, each adhesive layer directly contacting the second resin of one chip sealing body and the first resin of another chip sealing body.

20. A semiconductor chip stacked body, according to claim 1, wherein the conductive bonding wire is provided to continuously directly contact at least one side surface of the stacked plurality of chip sealing bodies from a first position to a second position along the at least one side surface, the first position being disposed between the exposed end portion of the conductive connecting material of the chip sealing body nearest the wiring substrate and the wiring substrate, and the second position disposed such that the exposed end portion of the conductive connecting material of the modular chip sealing body furthest from the wiring substrate is between the second position and the wiring substrate.

21. A semiconductor chip stacked body according to claim 18, wherein, the semiconductor integrated circuit and the pad are provided on the first surface of the semiconductor chip, the first resin cooperates with the pad to cover an entirety of the first surface of the semiconductor chip, the second resin covers an entirety of the second surface of the semiconductor chip, and at least one of the first resin and the second resin directly contacts and covers side surfaces of the semiconductor chip such that the first resin and the second resin cooperate to directly contact and cover an entirety of the semiconductor chip except for the exposed end portion of the conductive connecting material.

* * * * *